(12) United States Patent
Kato et al.

(10) Patent No.: US 7,042,798 B2
(45) Date of Patent: May 9, 2006

(54) MEMORY CONTROL DEVICE AND MEMORY CONTROL METHOD

(75) Inventors: Yoshiharu Kato, Kasugai (JP); Gen Tsukishiro, Kasugai (JP); Yoshihiro Takemae, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 10/853,313

(22) Filed: May 26, 2004

(65) Prior Publication Data

US 2005/0157585 A1    Jul. 21, 2005

(30) Foreign Application Priority Data

Jan. 20, 2004    (JP) .............................. 2004-011856

(51) Int. Cl.
*G11C 8/00*    (2006.01)

(52) U.S. Cl. ...................... 365/233; 365/222; 365/203

(58) Field of Classification Search ................ 365/233, 365/222, 203
See application file for complete search history.

(56) References Cited

U.S. PATENT DOCUMENTS 6,243,320 B1 *    6/2001    Hamamoto et al. ......... 365/233

6,876,592 B1 *    4/2005    Takahashi et al. .......... 365/222

FOREIGN PATENT DOCUMENTS

JP         2000-029779         1/2000

* cited by examiner

*Primary Examiner*—Huan Hoang
(74) *Attorney, Agent, or Firm*—Arent Fox PLLC

(57) ABSTRACT

It is intended to provide a memory control device and memory control method capable of reducing charge/discharge current consumed while various commands are inputted to a semiconductor memory device and reducing occurrence of power noises. During periods TT1, TT2, and TT3 which are parts of a period tCKE in which a clock enable signal CKE is in active state, supply of a control clock SD_CLK from a memory control device 1 to a synchronous-type semiconductor memory device 12 can be stopped. Furthermore, in case an input of a data input/output period of an external command and that of refresh operation period of a refresh command RCMD overlap and an access region of the external command and that of the refresh command RCMD do not coincide, those commands are converted to control command signal SD_CMD in parallel, whereby parallel conversion processing operation can be conducted.

13 Claims, 22 Drawing Sheets

CIRCUIT STRUCTURE DIAGRAM OF MEMORY CONTROL DEVICE 1 DIRECTED TO FIRST EMBODIMENT

FIG.1 PRINCIPLE DIAGRAM OF FIRST CONCEPT DIRECTED TO PRESENT INVENTION

FIG.2 CIRCUIT STRUCTURE DIAGRAM OF MEMORY CONTROL DEVICE 1 DIRECTED TO FIRST EMBODIMENT

OPERATIONAL WAVEFORM OBTAINED WHEN MEMORY CONTROL DEVICE 1 IS IN READ OPERATION

OPERATIONAL WAVEFORM OBTAINED WHEN MEMORY CONTROL DEVICE 1 IS IN WRITE OPERATION

FIG.5 CIRCUIT STRUCTURE DIAGRAM OF READ EXTENSION CIRCUIT 6

OPERATIONAL WAVEFORM OF READ EXTENSION CIRCUIT 6

FIG.7 CIRCUIT STRUCTURE DIAGRAM OF WRITE EXTENSION CIRCUIT 5

OPERATIONAL WAVEFORM OF WRITE EXTENSION CIRCUIT 5

FIG. 9 SECOND CONCEPTUAL DIAGRAM OF PRESENT INVENTION

FIG.10 CIRCUIT STRUCTURE DIAGRAM OF MEMORY CONTROL DEVICE 1a DIRECTED TO FIRST EMBODIMENT

FIG.11 CIRCUIT DIAGRAM OF COMMAND GENERATOR CIRCUIT 31

FIG.12 OPERATIONAL DIAGRAM OF COMMAND GENERATOR CIRCUIT 31

FIG.13 CIRCUIT STRUCTURE DIAGRAM OF ROR ADDRESS COUNTER 32

CIRCUIT STRUCTURE DIAGRAM OF COMMAND CONTROL CIRCUIT 34

FIG.15

TABLE SHOWING EXTERNAL COMMANDS CMD

| CMD2 | CMD1 | CMD0 | COMMAND | /CS | /RAS | /CAS | /WE |
|---|---|---|---|---|---|---|---|
| L | L | L | IDLE | H | H | H | H |
| L | L | H | ACTV | L | L | H | H |
| L | H | L | READ | L | H | L | H |
| L | H | H | WRIT | L | H | L | L |
| H | L | L | PRE | L | L | H | L |

FIG.16 CIRCUIT STRUCTURE DIAGRAM OF ACCESS REGION JUDGE CIRCUIT 100

OPERATIONAL WAVEFORM OF MEMORY CONTROL DEVICE 1a
OBTAINED IN CASE OF OPERATION (A)

OPERATIONAL WAVEFORM OF MEMORY CONTROL DEVICE 1a
OBTAINED IN CASE OF OPERATION (B)

OPERATIONAL WAVEFORM OF MEMORY CONTROL DEVICE 1a OBTAINED IN CASE OF OPERATION (C)

OPERATIONAL WAVEFORM OF MEMORY CONTROL DEVICE 1a
OBTAINED IN CASE OF OPERATION (D)

BLOCK DIAGRAM OF CONVENTIONAL MEMORY CONTROL DEVICE

TIMING CHART OF CONVENTIONAL MEMORY CONTROL DEVICE

MEMORY CONTROL DEVICE AND MEMORY CONTROL METHOD

CROSS-REFERENCE TO RELATED APPLICATIONS

This application is based upon and claims the benefit of priority from each of the prior Japanese Patent Application No. 2004-011856 filed on Jan. 20, 2004, the entire contents of which are incorporated herein by reference.

BACKGROUND OF THE INVENTION

1. Field of the Invention

The present invention relates to a memory control device and memory control method capable of reducing charge/discharge current consumed during inputs of various commands to a semiconductor memory device and reducing occurrence of power noises.

2. Description of Related Art

Due to miniaturization of portable electric appliances of these days, there have increased the number of multi-chip-package-type semiconductor devices and that of system-in-package-type semiconductor devices wherein plural chips are built in a single package. Since plural chips are built in a single package, heat and power noises occur at the plural chips.

For preventing heat in a package, it is required to reduce current consumption at each chip. Especially, a synchronous dynamic random access memory (abbreviated as SDRAM hereinafter) and the like increase current consumption due to large volume design. Therefore, reduce of current consumption is important. Since conventional memory control devices for controlling data access to an SDRAM did not have control function for lowering current consumption at an SDRAM, a clock enable signal CKE was always kept in active state and a clock signal was constantly inputted while an SDRAM was in active state. Since a clock signals was constantly inputted, an internal circuit in an SDRAM continued to consume power and additionally, charge/discharge of wiring capacity held by wirings between an SDRAM and a memory control device consumed power, as well. Those were problems. JP Laid-open Patent Publication No. 2000-29779 discloses countermeasure to resolve the above-described problem and, FIG. 21 and FIG. 22 show a block diagram of an image processing device (memory control device) and a timing chart of the device, respectively. As shown in FIG. 21, an SDRAM control circuit 902b changes state of a clock enable signal CKE from inactive state change to active state while the SDRAM control circuit 902b receives an imaging start signal and an output start signal and the image processing device completes imaging or data outputting. A clock enable signal CKE is also supplied to a gate signal generator circuit 902d to generate a gate signal for turning a clock signal ON/OFF and a gate signal is supplied to a clock driver 903. The clock driver 903 changes state of a clock signal from stop-operation state to start-operation state while a clock enable signal CKE in active state changes into active state, that is, while input and output of image data are executed. Furthermore, when state of a clock enable signal CLK changes from active state to inactive state, the clock driver 903 changes state of a clock signal CLK from start-operation state to stop-operation state. As shown in FIG. 22, an image data write start signal WriteStart changes state of a clock enable signal CKE from inactive state to active state and also changes state of a clock signal from stop-operation state change to start-operation state. By supplying command signals such as bank active, write, pre-charge and the like and a write image data signal Data, image data can be written on an SDRAM 901. In the image processing device directed to JP Laid-open Patent Publication No. 2000-29779, a clock signal CLK is supplied to the SDRAM in response to a clock enable signal CKE state of which changes to active state during input/output of image data to an SDRAM. A clock signal CLK is stopped without input/output of image data so that operation of an internal circuit in an SDRAM is stopped to reduce power consumption at the internal circuit and to reduce power consumption due to wiring capacity held by wiring between an SDRAM and a memory control device.

Furthermore, according to normal specification of SDRAM, the number of sense amplifiers to be activated concurrently is made different between a refresh operation period and a normal operation period. For example, in a 64MSDRAM, the number of sense amplifiers to be activated concurrently at the time of auto-refresh period and self-refresh period is 16(k) while it is 4(k) at the time of normal operation period. Since refresh operation must be completed within a predetermined period so as to avoid data destruction, the number of sense amplifiers to be activated concurrently at the time of refreshment is set to a large number.

SUMMARY OF THE INVENTION

However, in JP Laid-open Patent Publication No. 2000-29779, a clock signal is inputted to an SDRAM in response to a clock enable signal CKE state of which changed to active state during input/output of image data to an SDRAM. Since an unnecessary clock signal is supplied during input/output of image data in which synchronous operation with the aid of a clock signal is not required for input/output operation, operational current due to operation at the internal circuit and charge/discharge current to wiring capacity held by clock a signal are consumed and power noises occur. Those are problems.

Furthermore, in conventional SDRAMs, the number of sense amplifiers to be activated concurrently at the time of refresh operations for auto-refresh and self-refresh is set larger than at the time of normal operation. As the number of sense amplifiers to be activated concurrently is larger, a peak value of current consumed by an SDRAM and a peak value of power noise become larger. Therefore, there arise fears such that data destruction occurs at an SDRAM and erroneous operation is likely to occur at each chip in case plural chips are built in a single package. Those are problems. However, the number of sense amplifiers to be activated concurrently at the time of refresh operation for an SDRAM is set to a specified value which is normally determined by a refresh address generated in the SDRAM. Therefore, the memory control device cannot change the number of sense amplifiers to be activated concurrently, which is a problem. Furthermore, in case the number of sense amplifiers to be activated concurrently is reduced, refresh frequency must be increased so as to avoid data destruction. As a result, overhead time for refresh is increased and access operation gets slow, which is a problem.

The present invention has been made to resolve at least one of the above problems. The present invention provides a memory control device and memory control method capable of at least one of the followings: reducing charge/discharge current consumed during inputs of various commands to a semiconductor memory device; and reducing occurrence of power noises.

According to one aspect of the present invention, there is provided a memory control device for supplying a control clock and a control signal according to a to-be-inputted command signal to a synchronous-type semiconductor memory device, the memory control device comprising: a clock control circuit for informing a cycle period of a control clock required for executing a command at the synchronous type semiconductor memory device in accordance with the control signal; and a clock output circuit for outputting the control clock in accordance with an inform signal outputted from the clock control circuit.

According to the one aspect of the present invention, there is also provided a memory control method for supplying a control clock and a control signal depending on a to-be-inputted command signal to a synchronous-type semiconductor memory device, steps of the memory control method comprising: informing a cycle period of a control clock required for executing a command at the synchronous-type semiconductor memory device in accordance with the control signal; and outputting the control clock in response to information of the cycle period of the control clock.

The clock control circuit or the step of informing a cycle period of a control clock informs a cycle period of a control clock required for executing a command at the synchronous-type semiconductor memory device in accordance with a control signal to be supplied. The clock control circuit or the step of informing a cycle period of a control clock outputs a control signal in accordance with an inform signal outputted from the clock control circuit. A control clock is outputted just during a period which requires synchronous operation by a clock signal in response to each control signal which supplies a control command to the synchronous-type semiconductor memory device, and after a lapse of the period, an input of a control clock is stopped.

The memory control device restrains an output of a control clock during a period which does not require a control clock in response to each control signal, whereby power consumption due to inputs of control clocks to a synchronous-type semiconductor memory device and occurrence of power noises can be reduced.

According to another aspect of the present invention, there is provided a memory control device for controlling a data input/output access operation of a synchronous-type semiconductor memory device including a plurality of access region to which data input and data output can be made independently in accordance with access command and access address, the memory control device comprising: a refresh control circuit for generating refresh command and refresh address both required for a refresh operation of the synchronous-type semiconductor memory device, and a switch signal for informing every time the refresh command is generated; and an access control circuit for outputting the refresh command and the refresh address to the synchronous-type semiconductor memory device depending on the switch signal, wherein the memory control device controls the synchronous-type semiconductor memory device to conduct a data input/output access operation and a refresh operation in parallel.

The refresh control circuit generates a refresh command, a refresh address, and a switch signal. A switch signal is generated every time a refresh command is generated for informing a refresh command being generated. The access control circuit outputs an access command and an access address to the synchronous-type semiconductor memory device and also outputs a refresh command and a refresh address to the synchronous-type semiconductor memory device in accordance with a switch signal. Access commands have variety of an active command, a read command, a write command, a pre-charge command, and the like. Refresh commands have variety of an active command, a pre-charge command, and the like.

Thereby, a refresh command and a refresh address required for a refresh operation of the synchronous-type semiconductor memory device are supplied from the memory control device and the number of sense amplifiers to be activated concurrently can be designated from the memory control device side. Therefore, a peak value of noises can be reduced by designating reduced number of sense amplifiers to be activated concurrently. Furthermore, even if the number of sense amplifiers to be activated concurrently is reduced to lower a peak value of noises while refresh frequency increases, the synchronous-type semiconductor memory device is controlled to conduct a data input/output access operation and a refresh operation in parallel. Therefore, overhead time for a refresh operation is not increased and delay of an access operation can be prevented.

The above novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 15 is a table showing external commands CMD;

DETAILED DESCRIPTION OF THE PREFERRED EMBODIMENTS

Figure 1:
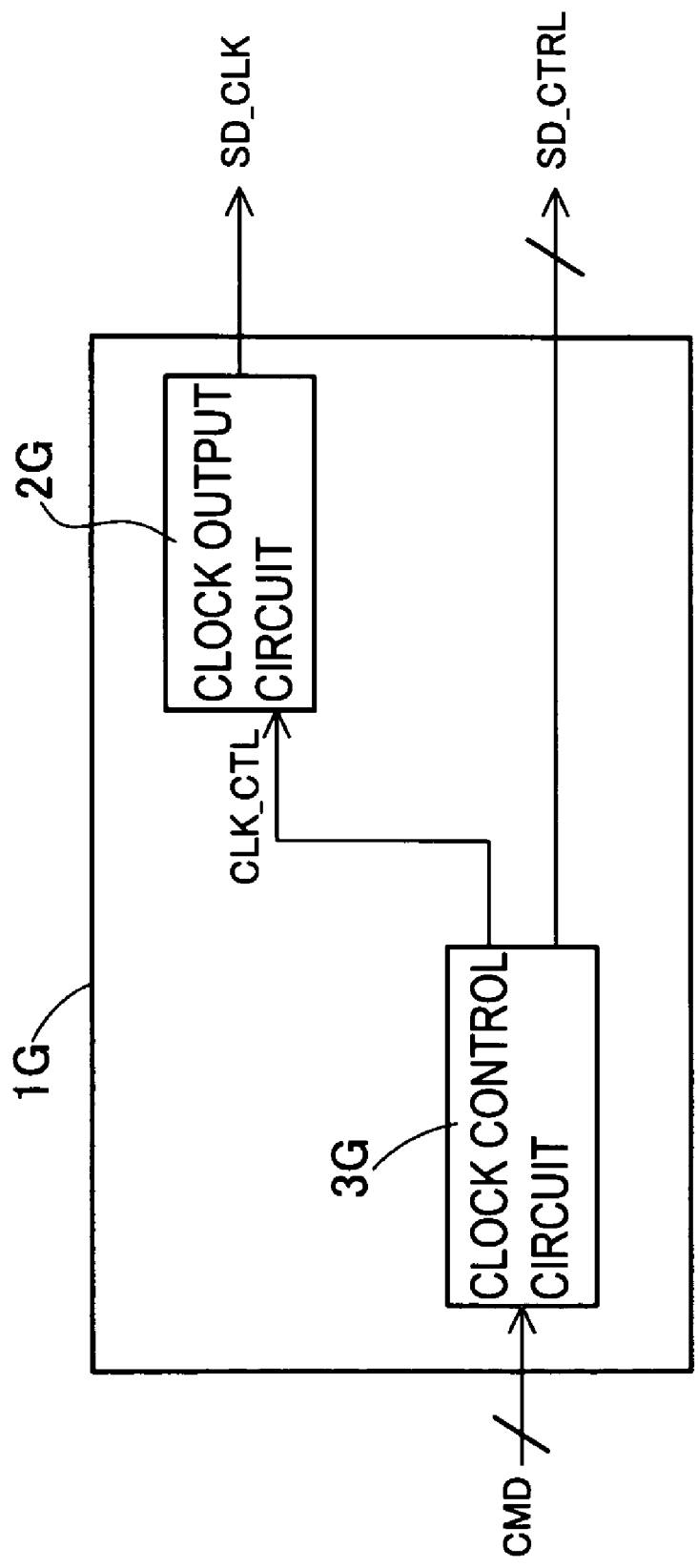
FIG. 1 is a principle diagram of first concept directed to the present invention.

Preferred embodiments of a memory control device and memory control method directed to the present invention will be described in detail below with reference to FIG. 1 through FIG. 20. FIG. 1 shows a principle diagram of first concept. A memory control device 1G is equipped with a clock output circuit 2G and a clock control circuit 3G. Upon receipt of an external command CMD to be inputted to the memory control device 1G, the clock control circuit 3G outputs a clock inform signal CLK_CTL, in response to the external command CMD, to the clock output circuit 2G. The clock control circuit 3G also outputs a control signal SD_CTRL to a synchronous-type semiconductor memory device (not shown). When a clock inform signal CLK_CTL is inputted to the clock output circuit 2G, a control clock SD_CLK is outputted to the synchronous-type semiconductor memory device in response to the clock inform signal CLK_CTL. Thereby, the clock output circuit 2G outputs a control clock SD_CLK just during a clock cycle required for completion of control, per each control signal SD_CTRL for supplying a control command to the synchronous-type semiconductor memory device. The clock output circuit 2G stops outputting a control clock SD_CLK during a period which follows to the clock cycle required for completion of control. The memory control device 1G restrains an output of a control clock SD_CLK during a period which does not require an input of a control clock SD_CLK per each control signal SD_CTRL. Thereby, power consumption and occurrence of power noises due to inputs of clocks to the synchronous semiconductor memory device can be reduced.

Figure 2:
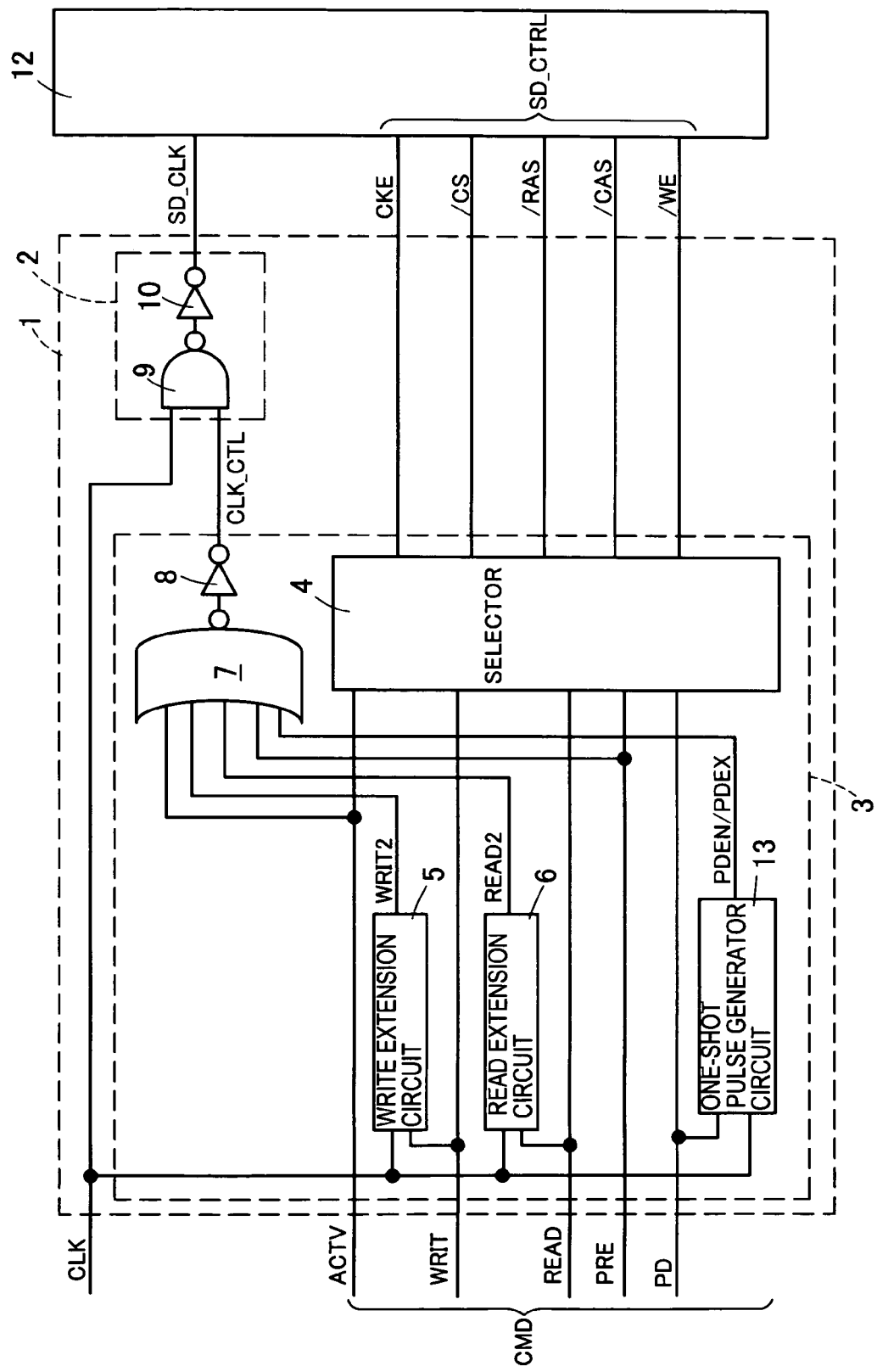
FIG. 2 is a circuit structure diagram of a memory control device 1 directed to a first embodiment.

A first embodiment directed to the first principle diagram of the present invention will be described by referring to FIG. 2 through FIG. 4. FIG. 2 shows a circuit structure diagram of a memory control device 1 directed to the first embodiment. The memory control device 1 includes a clock output circuit 2, a clock control circuit 3, and a selector 4. The clock output circuit 2 consists of a NAND gate 9 and an inverter 10. The clock control circuit 3 consists of a write extension circuit 5, a read extension circuit 6, a NOR gate 7, an inverter 8, and a one-shot pulse generator circuit 13. External commands CMD have variety of an active command ACTV, a read command READ, a write command WRIT, a pre-charge command PRE, a power down command PD, and the like. When an external command CMD is inputted to the selector 4 in the memory control device 1, a corresponding control signal SD_CTRL (a chip select signal /CS, a row address strobe signal /RAS, a column address strobe signal /CAS, a write enable signal /WE, a clock enable signal CKE, and the like) is outputted from the selector 4 to a synchronous-type semiconductor memory device 12. An external command CMD may be directly supplied from a CPU or the like to the synchronous-type semiconductor device 12 or may be supplied as a decoded signal decoded by a not-shown decoder, consisting of predetermined bit rows supplied from a CPU or the like, in response to a command for requesting data access such as read and write.

A write command WRIT and an external clock CLK are inputted to the write extension circuit 5 from which a corresponding output signal WRIT2 is inputted to the NOR gate 7. Furthermore, a read command READ and an external clock CLK are inputted to the read extension circuit 6 from which a corresponding output signal READ2 is inputted to the NOR gate 7. Furthermore, a power down command PD and an external clock CLK are inputted to the one-shot pulse generator circuit 13 from which a corresponding output signal, namely, a power down exit signal PDEX or a power down entry signal PDEN, is inputted to the NOR gate 7. Similarly, an active command ACTV and a pre-charge command PRE are inputted to the NOR gate 7. Through the inverter 8, an output from the NOR gate 7 is outputted as a clock inform signal CLK_CTL and further inputted to the NAND gate 9 in the clock output circuit 2. Furthermore, an external clock CLK is inputted to the NAND gate 9. An output from the NAND gate 9, passing through the inverter 10, is outputted as a control clock SD_CLK and further inputted to the synchronous-type semiconductor memory device 12.

Figure 3:
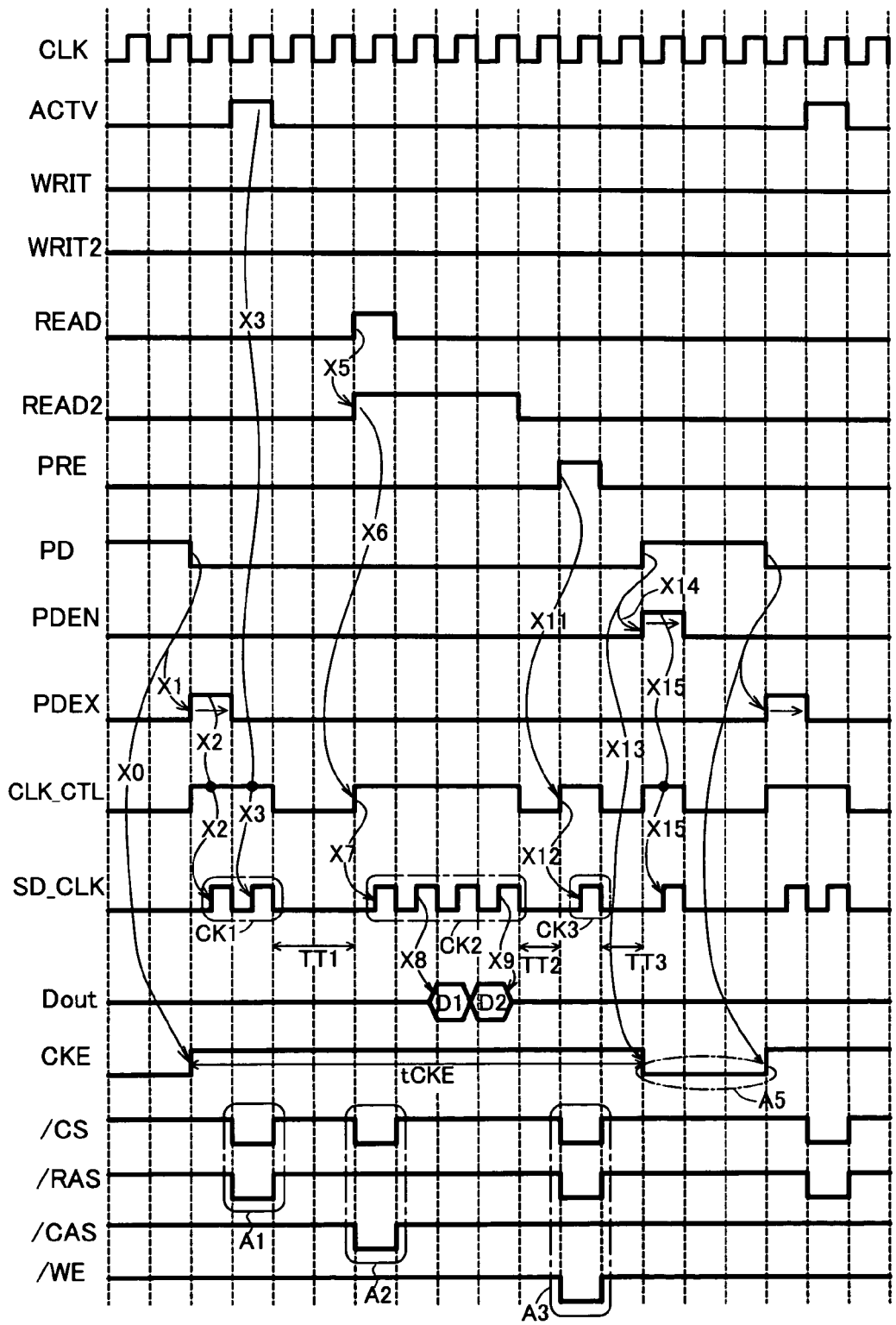
FIG. 3 shows operational waveform obtained when the memory control device 1 is in read operation.

FIG. 3 shows operational waveform obtained when the memory control device 1 is in read operation. CAS latency takes two clocks (the number of clock cycles required for inputting a control signal SD_CTRL for read operation and outputting read data Dout) and burst length corresponds to two clocks. When level of a power down command PD to be inputted to the clock control circuit 3 shifts from high level to low level (a command to exit from power down state), a clock enable signal CKE is set in high level as a control signal SD_CTRL (arrow X0). A power down exit signal PDEX, one-clock-cycled high level signal, is outputted from the one-shot pulse generator circuit 13 in response to falling of a power down command PD and further inputted to the NOR gate 7 (arrow X1). When the power down exit signal PDEX in high level is inputted to the NOR gate 7, level of an output from the NOR gate 7 changes to low level and is inverted to high level at the inverter 8 and then, inputted to the NAND gate 9 in the clock output circuit 2 as a clock inform signal CLK_CTL (arrow X2). An external clock CLK has been inputted to the NAND gate 9 by the time the clock inform signal CLK_CTL is inputted to the NAND gate 9. Only when a clock inform signal CLK_CTL is in high level, a control clock SD_CLK in synchronous with an external clock CLK is outputted to the synchronous-type semiconductor memory device 12 (arrow X2).

When an active command ACTV in high level is inputted to the selector 4, a clock enable signal /CS and a row address strobe signal /RAS are set in low level (region A1), the active command ACTV in high level is inputted to the synchronous-type semiconductor memory device 12. Furthermore, when an active command ACTV in high level is inputted to the NOR gate 7, a clock inform signal CLK_CTL is set in high level and inputted to the NAND gate 9 in the clock output circuit 2 (arrow X3), and then, a control clock SD_CLK in synchronous with an external clock CLK is outputted to the synchronous-type semiconductor memory device 12 (arrow X3). Thereby, just during a period required for inputting clocks (a two-clock period in which it exits from power down state and a control signal SD_CTRL required for active operation is inputted to the synchronous-type semiconductor memory device 12), control clocks SD_CLK are outputted to the synchronous-type semiconductor memory device 12 (region CK1).

When a read command READ in high level is inputted to the selector 4, a chip select signal /CS and a column address strobe signal /CAS are set in low level and the read command READ in high level is outputted to the synchronous-type semiconductor memory device 12 as a control signal SD_CTRL (region A2). Furthermore, the read command READ in high level is also inputted to the read extension circuit 6. Upon receiving an input of the read command READ in high level, the read extension circuit 6 outputs an output signal READ2 in high level during a period corresponding to a four-clock-cycle of external clocks CLK (arrow 5). The read extension circuit 6 is a circuit for detecting the number of clock cycles required for read operation at the synchronous-type semiconductor memory device 12 and the number of clock cycles required depends on CAS latency, burst length and the like designated for various memories. In this embodiment, since two clocks for CAS latency and two clocks for burst length are taken, four clocks are required in total. An output signal READ2 from the read extension circuit 6 is inputted to the NOR gate 7. During a four-clock-cycle of external clocks CLK, a clock inform signal CLK_CTL level of which is inverted to high level through the inverter 8 is inputted from the NOR gate 7 to the NAND gate 9 in the output circuit 2 (arrow X6). By the time the clock inform signal CLK_CTL is inputted to the NAND gate 9, an external clock CLK has been inputted to there. A control clock SD_CLK in synchronous with an external clock CLK is outputted to the synchronous-type semiconductor memory device 12 during a four-clock-cycle of external clocks CLK (arrow X7).

In the synchronous-type semiconductor memory device 12, a chip select signal /CS and a column address strobe signal /CAS both in low level are read wherein read operation is triggered by a rising edge of a first clock out of control clocks SD_CLK to be inputted. Since CAS latency and bust length take two clocks, respectively, data read operation is started in response to a rising edge of a second clock out of the control clocks SD_CLK (arrow X8). After read data Dout is read during the second clock cycle, a terminal for read data Dout is set in high impedance in response to a rising edge of a fourth control clock SD_CLK and a data read out operation completes (arrow X9). Therefore, a control clock SD_CLK is inputted to the synchronous-type semiconductor memory device 12 only while a chip select signal /CS and a column address strobe signal /CAS both in low level are inputted to the synchronous-type semiconductor memory device 12 and read data Dout is read out, i.e., during a four-clock-cycle in which an input of a clock is required for read operation (region CK2).

When a pre-charge command PRE in high level is inputted to the selector 4, a chip select signal /CS, a row address strobe signal /RAS and a write enable signal /WE are set in low level and those signals are outputted to the synchronous-type semiconductor memory device 12 (region A3). Furthermore, the pre-charge command PRE in high level is inputted to the NOR gate 7 and a clock inform signal CLK_CTL in high level is inputted to the NAND gate 9 in the clock output circuit 2 passing through the inverter 8 (arrow X11), and then a control clock SD_CLK of a one-clock-cycle is outputted to the synchronous-type semiconductor memory device 12 (arrow X12). Therefore, a control clock SD_CLK is inputted to the synchronous-type semiconductor memory device 12 only while a period of a one-clock-cycle in which a chip select signal /CS, a row address strobe signal /RAS, a write enable signal /WE all in low level are inputted to the synchronous-type semiconductor memory device 12, that is, during a period in which an input of a control clock SD_CLK is required for pre-charge operation (region CK3).

After a pre-charge operation a series of data read operations to follow the pre-charge operation complete, it is set in power down state. As a command for entering to power down state, when level a power down command PD is changed from low level to high level, a clock enable signal CKE outputted from the selector 4 as a control signal SD_CTRL is set in low level (arrow X13). The clock enable signal CKE is kept in low level while power down state is kept (region A5). Furthermore, a power down entry signal PDEN, a one-clock-cycled high level signal, is outputted from the one-shot pulse generator circuit 13 in response to a rising edge of a power down command PD and further inputted to the NOR gate 7 (arrow X14). When the power down entry signal PDEN in high level is inputted to the NOR gate 7, a clock inform signal CLK_CTL is inputted to the NOR gate 9 in the clock output circuit 2 (arrow X15), whereby a control clock SD_CLK in synchronous with an external clock CLK is outputted to the synchronous-type semiconductor memory device 12 (arrow X15).

Therefore, a control clock SD_CLK is never outputted to the synchronous-type semiconductor memory device 12 during the following three periods: a period TT1, from completion of an input of an active command ACTV to the memory control device 1 till an input of a read command READ; a period TT2, from an output of a read command data Dout from the synchronous semiconductor memory device till an input of a pre-charge command PRE; and a period TT3, from completion of an input of an pre-charge command PRE till completion of a pre-charge operation. The above those three periods constitute some parts of a period tCKE in which a clock enable signal CKE is in active state.

Figure 4:
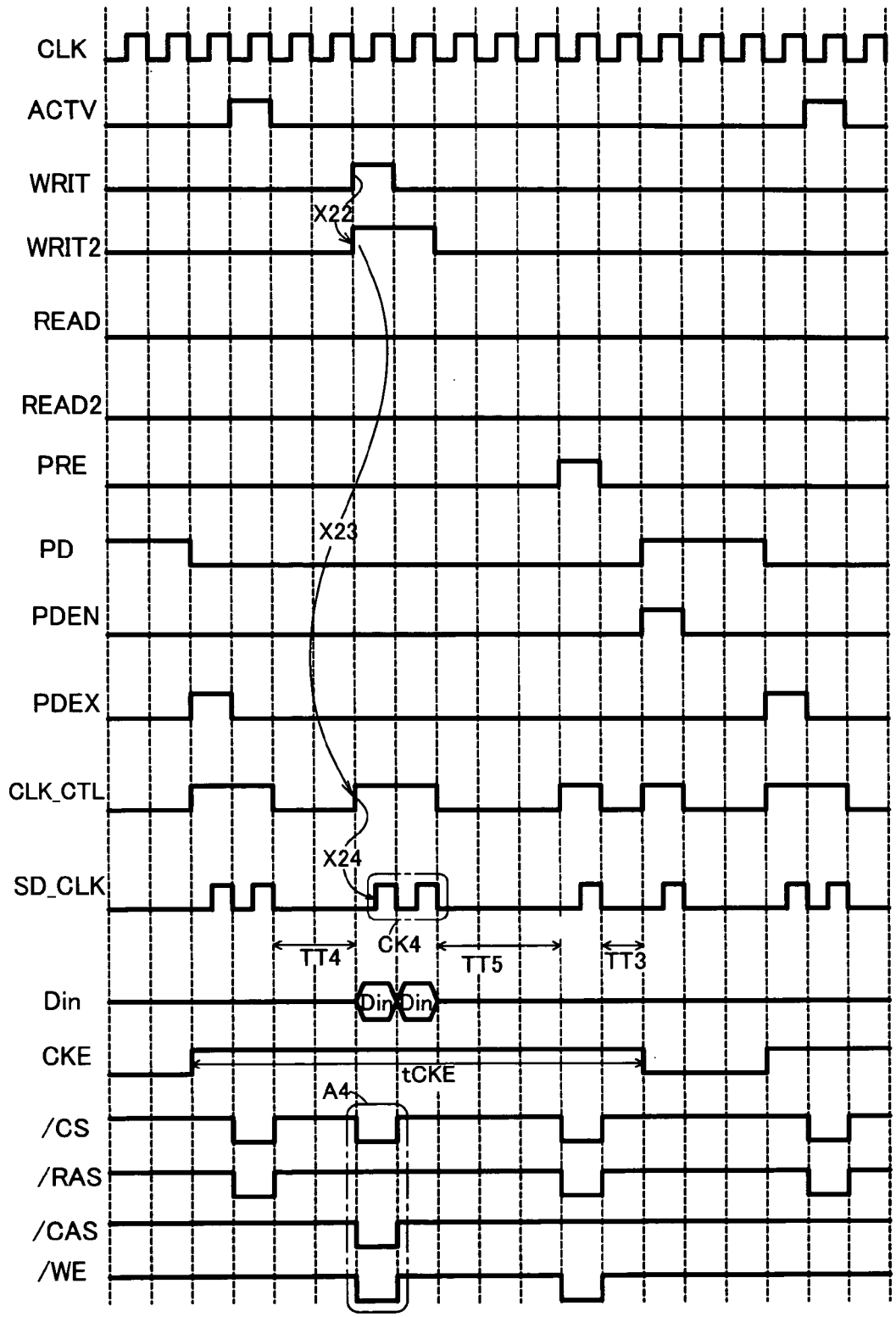
FIG. 4 shows operational waveform obtained when the memory control device 1 is in write operation.

The FIG. 4 shows operational waveform obtained when the memory control device 1 is in write operation. Burst operation herein takes two clocks. When a write command WRIT in high level is inputted to the selector 4, a chip select signal /CS, a column address strobe signal /CAS and a write enable signal /WE are set in low level and those signals are outputted to the synchronous-type semiconductor memory device 12 as control signals SD_CTRL (region A4). When a write command WRIT in high level is inputted to the write extension circuit 5 from which an output signal WRIT2 in high level corresponding to a two-clock-cycle of external clocks CLK is outputted (arrow X22) and further inputted to the NOR gate 7. The write extension circuit 5 is a circuit for detecting the number of clock cycles required for a write operation. The number of clock cycles required depends on burst length and the like, i.e., the number of clock cycles is designated by respective types of memories. In this embodiment, since two clocks are required as burst length, two clocks are required for data input.

From the NOR gate 7, a clock inform signal CLK_CTL, two-clock-cycled high level signal, is inputted to the NAND gate 9 in the output circuit 2 through the inverter 8 (arrow X23) and two clocks of control clocks SD_CLK are inputted to the synchronous-type semiconductor memory device 12 (arrow X24). That is, the two clocks of control clocks SD_CLK required for a write operation and a control signal SD_CTRL are synchronized with each other and inputted to the synchronous-type semiconductor memory device 12. Since two clocks are required as burst length in the synchronous-type semiconductor memory device 12, data Din is written on there during a two-clock cycle of control clocks SD_CLK after an input of a write command WRIT. Therefore, a control clock SD_CLK is outputted to the synchronous-type semiconductor memory device 12 during a period of a clock cycle in which a chip select signal /CS, a column address strobe signal /CAS, a write enable signal /WE, all in low level, are inputted to the synchronous-type semiconductor memory device 12 to write data Din in there, i.e., a period that requires inputs of clocks for a write operation (region CK4). A control clock SD_CLK is never outputted to the synchronous-type semiconductor memory device 12 while some partial periods in a period tCKE in which a clock enable signal CKE is in active state. The some partial periods of the period tCKE are: a period TT4, from an input of an active command ACTV to the memory control device 1 till an input of a write command WRIT; a period TT5, from write of data Din on the synchronous-type semiconductor memory device 12 till an input of a pre-charge command PRE to the memory control device 1; and a period TT3, from an input of a pre-charge command PRE till termination of a pre-charge operation. Since other operations have operational waveform similar to that of read operation in FIG. 3, descriptions of the other operations are omitted.

Figure 5:
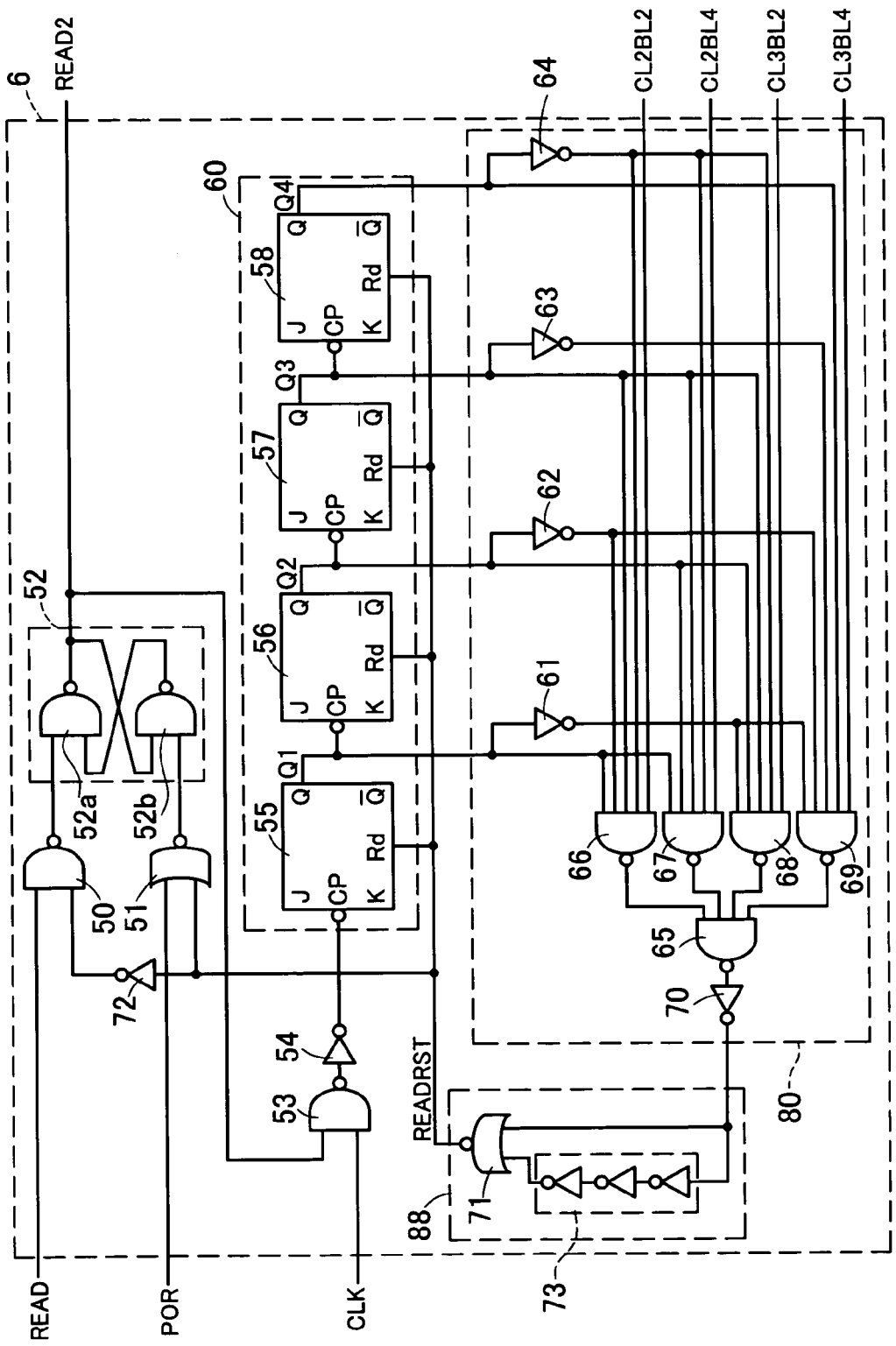
FIG. 5 is a circuit structure diagram of a read extension circuit 6.
Figure 6:
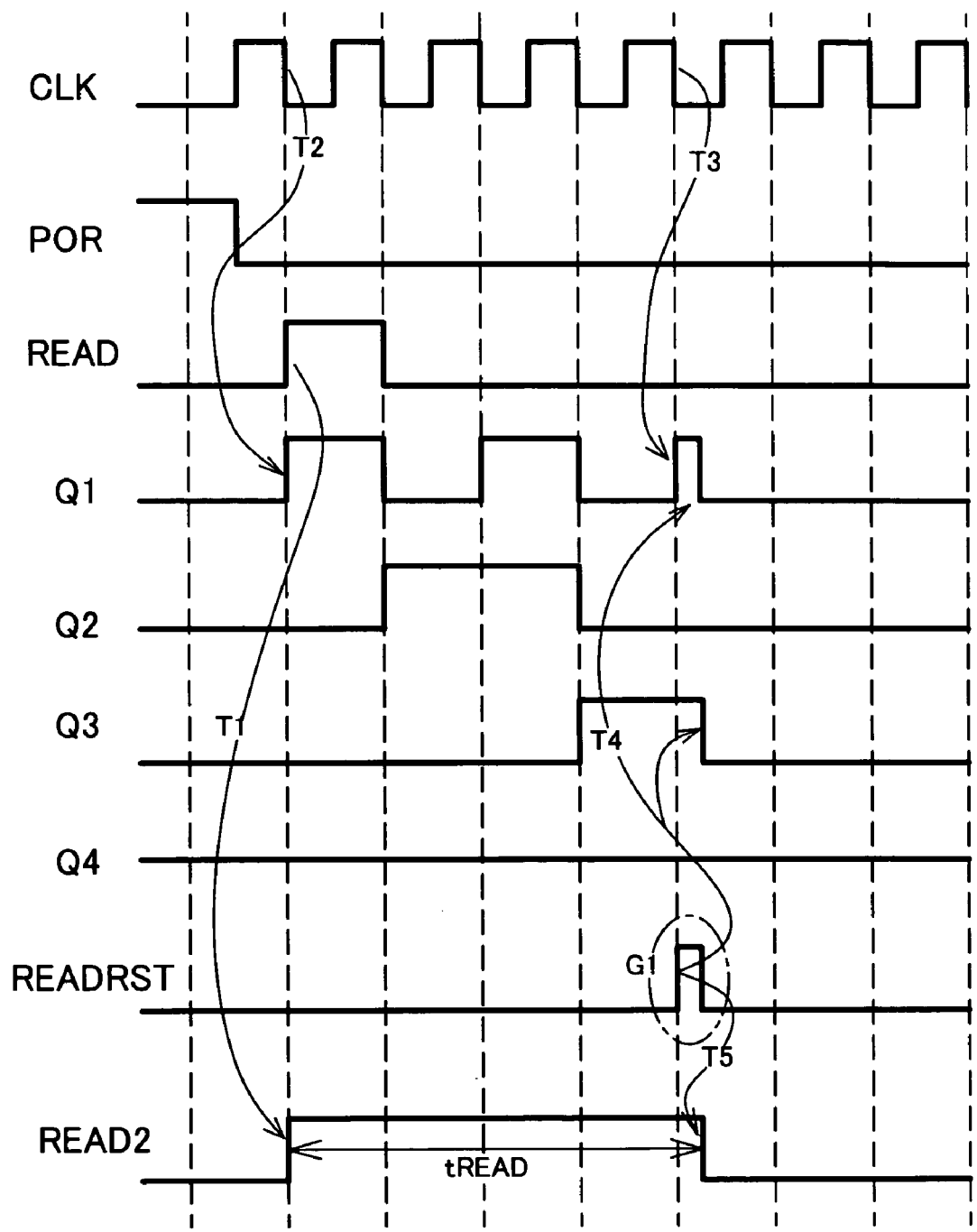
FIG. 6 shows operational waveform of the read extension circuit 6.

FIG. 5 and FIG. 6 show a specific example of the read extension circuit 6. The read extension circuit 6 is a circuit for detecting the number of clock cycles required for read operation in the synchronous-type semiconductor memory device 12 (FIG. 2). The number of clock cycles is determined by CAS latency CL, burst length BL and the like of respective types of memories. In this embodiment, CAS latency requires two clocks and burst length also requires two clocks. Therefore, detection of a four-clock cycle is required. Referring to the circuit diagram of FIG. 5 directed to the read extension circuit 6, a read command READ, a power on reset signal POR, an external clock CLK, read period signals CL2BL2, CL2BL4, CL3BL2, CL3BL4 are inputted and subsequently, an output signal READ2 is outputted. The read extension circuit 6 includes a NAND gate 50 to which a read command READ is inputted and a NOR gate 51 to which a power on reset signal POR is inputted. An output from the NAND gate 50 and that of the NOR gate 51 are inputted to a NAND gate 52a and a NAND gate 52b, respectively. Furthermore, the NAND gate 52a and the NAND gate 52b constitute a flip-flop section 52. An output from the flip-flop section 52 is outputted as an output signal READ 2 from the read extension circuit 6 and also inputted to a NAND gate 53. An external clock CLK is inputted to the NAND gate 53. An output from the NAND gate 53 is inverted through an inverter 54 and further inputted to a clock terminal CP of a JK flip-flop 55, an initial stage in a binary counter 60. The binary counter 60 is constituted by connecting output terminals Q1 through Q3 for JK flip-flops 55 through 58, respectively, in series. High level signals are constantly inputted to J terminals and K terminals of respective flip-flops, and a read reset signal READRST, an output from a NOR gate 71, is inputted to a ready terminal Rd of each flip-flop.

An output terminal Q1 of the JK flip-flop 55 is connected to NAND gates 66 and 67. An output terminal Q2 of the JK flip-flop 56 is connected to NAND gates 67 and 68. An output terminal Q3 of the JK flip-flop 57 is connected to NAND gates 66, 67, and 68. An output terminal Q4 of the JK flip-flop 58 is connected to a NAND gate 69. The output terminal Q1 of the JK flip-flop 55 is connected to the NAND gates 68 and 69 via an inverter 61. The output terminal Q2 of the JK flip-flop 56 is connected to the NAND gates 66 and 69 via an inverter 62. The output terminal Q3 of the JK flip-flop 57 is connected to the NAND gate 69 via an inverter 63. The output terminal Q4 of the JK flip-flop 58 is connected to the NAND gates 66, 67 and 68 via an inverter 64. A read period signal CL2BL2, a read period signal CL2BL4, a read period signal CL3BL2, and a read period signal CL3BL4 are inputted to the NAND gate 66, NAND gate 67, NAND gate 68, and NAND gate 69 from a not-shown CPU and the like, respectively. Output terminals of the NAND gates 66 through 69 are connected to a NAND gate 65. An output signal from the NAND gate 65 is inverted by an inverter 70 and then, inputted to a pulse signal generator section 88. The pulse signal generator section 88 includes an inverter section 73 consisting of three inverters connected in series and a NOR gate 71. An output signal from the inverter 70 branches in two directions: one of them is directly inputted to a NOR gate 71 and the other one is inputted to the NOR gate 71 through the inverter section 73. An output signal from the NOR gate 71 is inputted to the JK flip-flops 55 through 58 in the binary counter 60 as read reset signal READRST, as well as inputted to the NOR gate 51 and an inverter 72. The output terminal of the inverter 72 is connected to a NAND gate 50.

There will be described a timing chart of FIG. 6. A power on reset signal POR is a signal to be inputted to the NOR gate 51 from a not-shown CPU or the like. The power on reset signal POR is in high level at the time of power-ON and level of the power on reset signal POR shifts to low level when voltage level of power reaches a certain voltage level. Furthermore, read period signals CL2BL2, CL2BL4, CL3BL2, and CL3BL4 are signals set in high level in accordance with CAS latency and burst length predetermined by respective types of memories. In this embodiment, CAS latency requires two clocks and burst length also requires two steps. Therefore, a read period signal CL2BL2 in high level is inputted to the NAND gate 66 whereas read period signals CL2BL4, CL3BL2, CL3BL4 are kept in low level.

In case a read command READ in high level is inputted from a not-shown CPU and the like to the NAND gate 50 after level of a power on reset signal POR shifts to low level, a signal in low level is inputted from the NAND gate 50 to the flip-flop section 52 and level of an output signal READ2 from the flip-flop section 52 shifts from low level to high level (arrow T1). Furthermore, the output signal READ2 in high level is also inputted to the NAND gate 53. While an output signal READ2 in high level is inputted, the NAND gate 53 outputs a signal in low level in synchronous with an external clock CLK in high level and level of the output is inverted from low level to high level through the inverter 54 and inputted to a clock terminal CP of the JK flip-flop 55. That is, it is an operation to transmit an external clock CLK to the binary counter 60. An output Q1 from the JK flip-flop 55, the initial stage in the binary counter 60, is set in high level along with falling of an external clock CLK which is a first clock coming after an output signal READ2 is set in high level (arrow T2). Subsequently, the binary counter 60 counts up along with falling of an external clock CLK, and outputs Q1 and Q3 are set in high level and outputs Q2 and Q4 are set in low level along with falling of an external clock CLK which is a fifth clock coming after the output signal READ2 is set in high level (arrow T3). At this stage, level of an output from the NAND gate 66 shifts from high level to low level because outputs Q1 and Q3 in high level, outputs Q2 and Q4 level of which are inverted to high level through the inverters 62 and 64, respectively, and a read period signal CL2BL2 in high level, i.e., high level signals only, are inputted to the NAND gate 66.

When the output of the NAND gate 66 of which level has shifted to low level is inputted to the NAND gate 65, a signal of which level has shifted from low level to high level is inputted from the NAND gate 65 to the inverter 70. A signal which has shifted from high level to low level is outputted from the inverter 70. When an output from the inverter 70 is set in low level, the signal in low level is inputted to the NOR gate 71 and to the inverter section 73. Level of an output from the inverter section 73 shifts from low level to high level with being delayed by predetermined length of time from a time point where level of an output from the inverter 70 shifts from high level to low level. Therefore, all of the inputs to be inputted to the NOR gate 71 are in low level during the delay time and a read reset signal READRST, a high-level pulse signal, is outputted from the NOR gate 71 (region G1). When a read reset signal READRST in pulse waveform is inputted to ready terminals Rd of the JK flip-flops 55 through 58 wherein all of the outputs Q1 through Q4 are reset to low level (arrow T4). Concurrently, the read reset signal READRST in pulse waveform is inputted to the NOR gate 51 and further inputted to the NAND gate 50 through the inverter 72, a low-level signal from the NOR gate 51 and a high level signal from the NAND gate 50 are inputted to the flip-flop section 52 and an output from the flip-flop section 52 (output signal READ2) is reset to low level (arrow T5). Therefore, the output signal READ2 is kept in high level during a period tREAD which is a four-clock cycle beginning with an input of a read command READ.

The read extension circuit 6 detects the number of four-clock cycles required for read operation at the synchronous-type semiconductor memory device 12 and the output signal READ2 is set in high level during the clock cycles detected. A six-clock-cycle period tREAD beginning with an input of a read command READ is detected in case a memory to be controlled has two-clock latency and four-clock burst length and a read period signal CL2BL4 in high level is inputted to the NAND gate 67. Similarly, a five-clock cycle of period tREAD is detected in case a memory has three-clock latency and two-clock burst length and a read period signal CL3BL2 is inputted to the NAND gate 68. Furthermore, a seven-clock-cycle period tREAD is detected in case a memory has three-clock latency and four-clock burst length and a read period signal CL3BL4 is inputted to the NAND gate 69.

Figure 7:
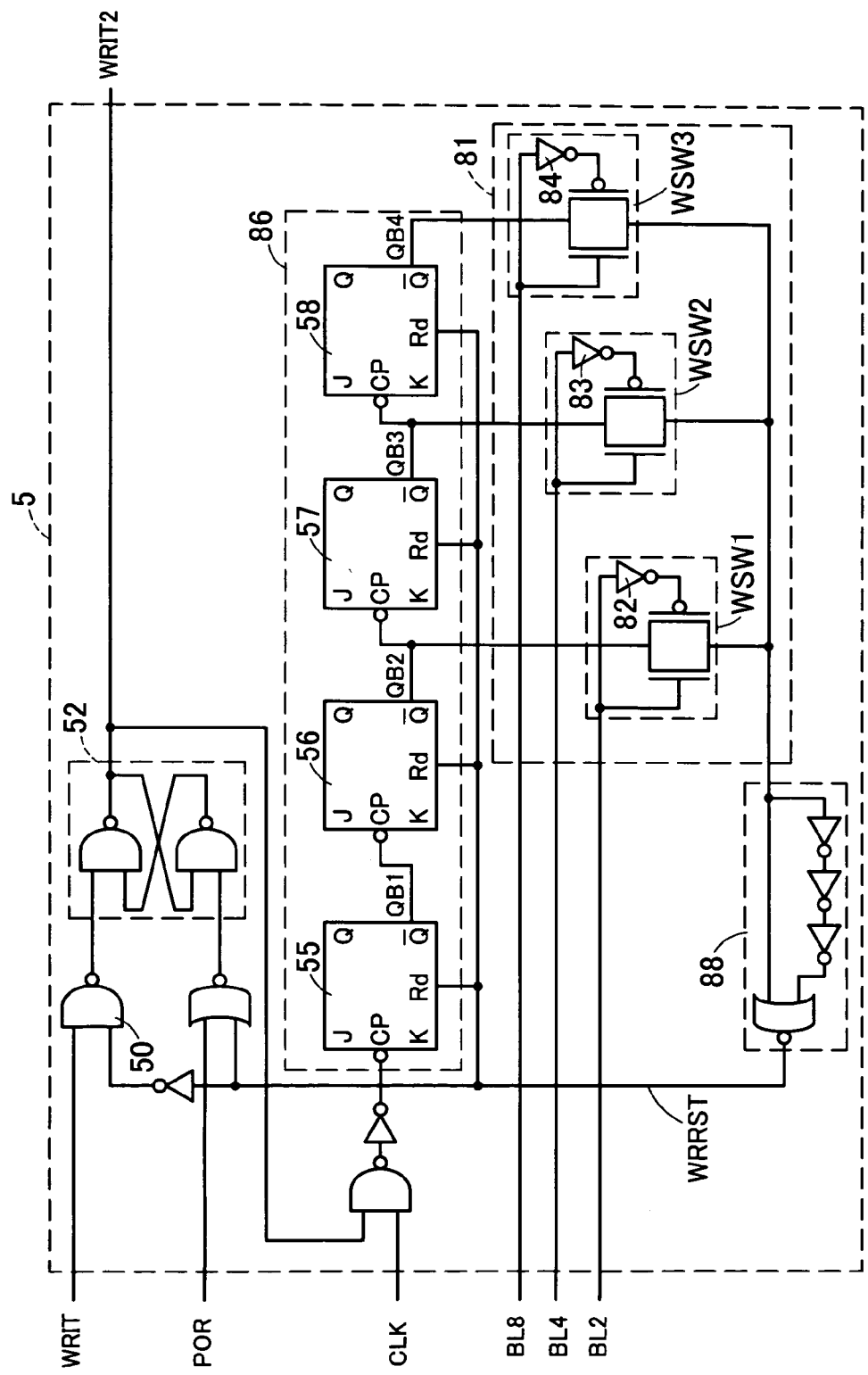
FIG. 7 is a circuit structure diagram of a write extension circuit 5.
Figure 8:
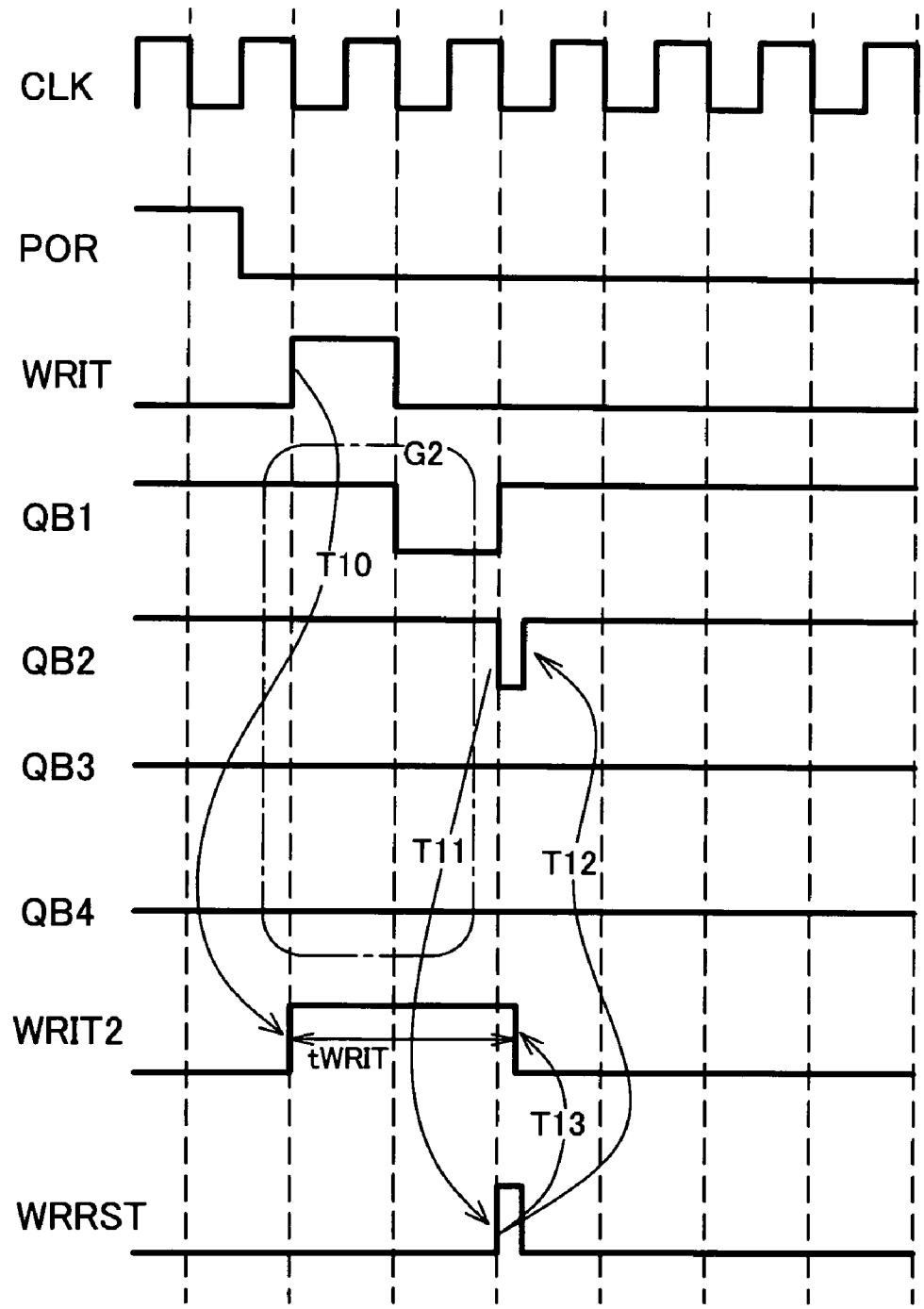
FIG. 8 shows operational waveform of the write extension circuit 5.

FIG. 7 and FIG. 8 show a specific example of the write extension circuit 5. The write extension circuit 5 is a circuit for detecting the number of clock cycles required for write operation at the synchronous-type semiconductor memory device 12. The number of required clock cycles is determined by burst length and the like of respective types of memories. In this embodiment, burst length requires two clocks. Therefore, detection of a two-clock cycle is required.

As shown in the circuit diagram of FIG. 7, the write extension circuit 5 includes a write detector section 81 and a down counter 86, instead of the read detector section 80 and the binary counter 60 for the read extension circuit 6 directed to FIG. 5. Furthermore, instead of a read command READ, a write command WRIT is inputted to a NAND gate 50. Instead of an output signal READ 2, an output signal WRIT2 is outputted from a flip-flop section 52. Furthermore, burst length signals BL2, BL4, and BL8 are inputted to the write detector section 81.

The write detector section 81 includes switches WSW1 through WSW3 to which negation outputs QB2 through QB4 from JK flip-flops 56 through 58 are inputted, respectively. Furthermore, burst length signals BL2, BL4 and BL8 are inputted to gates of NMOS transistors for the switches WSW1 through WSW3, inverted through inverters 82 through 84, and inputted to the gates of PMOS transistors for the switches WSW1 through WSW3. Those burst length signals BL2, BL4 and BL8 are signals inputted to the write extension circuit 5 from a not-shown CPU or the like, and they are set in high level in accordance with burst length designated for various memories. The down counter 86 includes JK flip-flops 55 through 58 and negation output terminals QB1 through QB3 for respective flip-flops are connected to clock terminals CP of respective JK flip-flops of their respective next stage. Since other structure of the write extension circuit 5 is similar to that of the read extension circuit 6 directed to FIG. 5, details are omitted herein.

In the present invention, burst requires two clocks. Therefore, the switch WSW1 is kept in conductive state and switches WSW2 and WSW3 are kept in non-conductive state on condition that, from a not-shown CPU and the like, a burst length signal BL2 in high level is inputted to the switch WSW1 and burst length signals BL4 and BL8 in low level are inputted to the switches WSW2 and WSW3, respectively. In case a write command WRIT in high level is inputted from the not-shown CPU to the NAND gate 50 after level of a power on reset signal POR shifts to low level, level of an output signal WRIT2 outputted from the flip-flop section 52 shifts from low level to high level (arrow T10). Similar to the operation in the read extension circuit 6, in the write extension circuit 5, the down counter 86 starts a count down operation in synchronous with an external clock CLK upon an input of an output signal WRIT 2 in high level, and negation outputs QB1 through QB4 are outputted (region G2). Since the switch WSW1 is set in conductive state, the negation output QB2 is inputted to a pulse signal generator section 88 through the switch WSW1. Along falling level of the negation output QB2 from high level to low level, a write reset signal WRRST, a high-level pulse signal, is outputted from the pulse signal generator section 88 (arrow T11). When a write reset signal WRRST in pulse waveform is inputted to ready terminals Rd of the JK flip-flops 55 through 58, level of all the negation outputs QB1 through QB4 are reset to high level (arrow T12). Similar to the operation in the read extension circuit 6, an output from the flip-flop section 52 (output signal WRIT2) is reset to low level in accordance with a write reset signal WRRST in pulse waveform (arrow T13). Therefore, the output signal WRIT2 is kept in high level during a period tWRIT which is a two-clock cycle beginning with an input of a write command WRIT.

Therefore, the number of two-clock cycles required for write operation in the synchronous-type semiconductor memory device 12 is detected and an output signal WRIT2 is set in high level during a period of clock cycles detected. In case a memory to be controlled has a four-clock burst length, tWRIT is detected during a period of four-clock cycle beginning with an input of a write command WRIT once a burst length signal BL4 in high level is inputted to the switch WSW2. Similarly, in case of eight-clock burst length, tWRIT is detected during a period of eight-clock cycle beginning with an input of a write command WRIT once a burst length signal BL8 in high level is inputted to the switch WSW3.

In the conventional memory control device, not only state control of a clock enable signal CKE but also control of stop-operation state/start-operation state of a clock signal are conducted simultaneously along with input/output of data to a synchronous-type semiconductor memory device. Since a control clock SD_CLK is supplied from the memory control device 1 to the synchronous-type semiconductor memory device 12 during the entirety of the period tCKE (FIG. 3 and FIG. 4) in which a clock enable signal CKE is in high level and active state, charge/discharge current is consumed constantly and power noises occur constantly during the period tCKE. Furthermore, the memory control device 1 and the synchronous-type semiconductor memory 12 are connected by wiring and there occurs power consumption due to charge/discharge of wiring capacity the wiring path has. However, in the memory control device 1 directed to the first embodiment, for read operation (FIG. 3), supply of a control clock SD_CLK from the memory control device 1 to the synchronous-type semiconductor memory device 12 can be stopped during periods TT1, TT2 and TT3 which are portions of a period tCKE in which clock enable signal CKE is in active state. Furthermore, for write operation (FIG. 4), supply of a control clock SD_CLK from the memory control device 1 to the synchronous-type semiconductor memory device 12 can be stopped during periods TT4, TT5, and TT3. In the first embodiment, the memory control device 1 restrains an input of a control clock SD_CLK during a period in which the synchronous-type semiconductor memory device 12 does not need an input of a control clock SD_CLK. Thereby, there can be suppressed power consumption and power noises caused by inputs of clocks to the synchronous-type semiconductor memory device 12.

The present invention is not limited to the embodiment described above and may of course be improved or modified in various manners within the scope and spirit of the present invention. In the first embodiment, the memory control device 1 restrains an input of a control clock SD_CLK during a period in which the synchronous-type semiconductor memory device 12 does not need an input of a control clock SD_CLK for read and write operations. However, it is not limited to the above-described manner. For example, for auto-refresh operation, it is possible that the memory control device 1 controls and allows a control clock SD_CLK to be inputted just during period(s) required for reading an auto-refresh command. Furthermore, for self-refresh operation, it is also possible that the memory control device 1 controls and allows a control clock SD_CLK to be inputted just during period(s) required for reading a command for self-refresh entry and a command for self-refresh exit. Furthermore, for operation under power down state, it is also possible that the memory control device 1 controls and allows a control clock SD_CLK to be inputted just during period(s) required for reading a command for power down entry and a command for power down exit.

Figure 9:
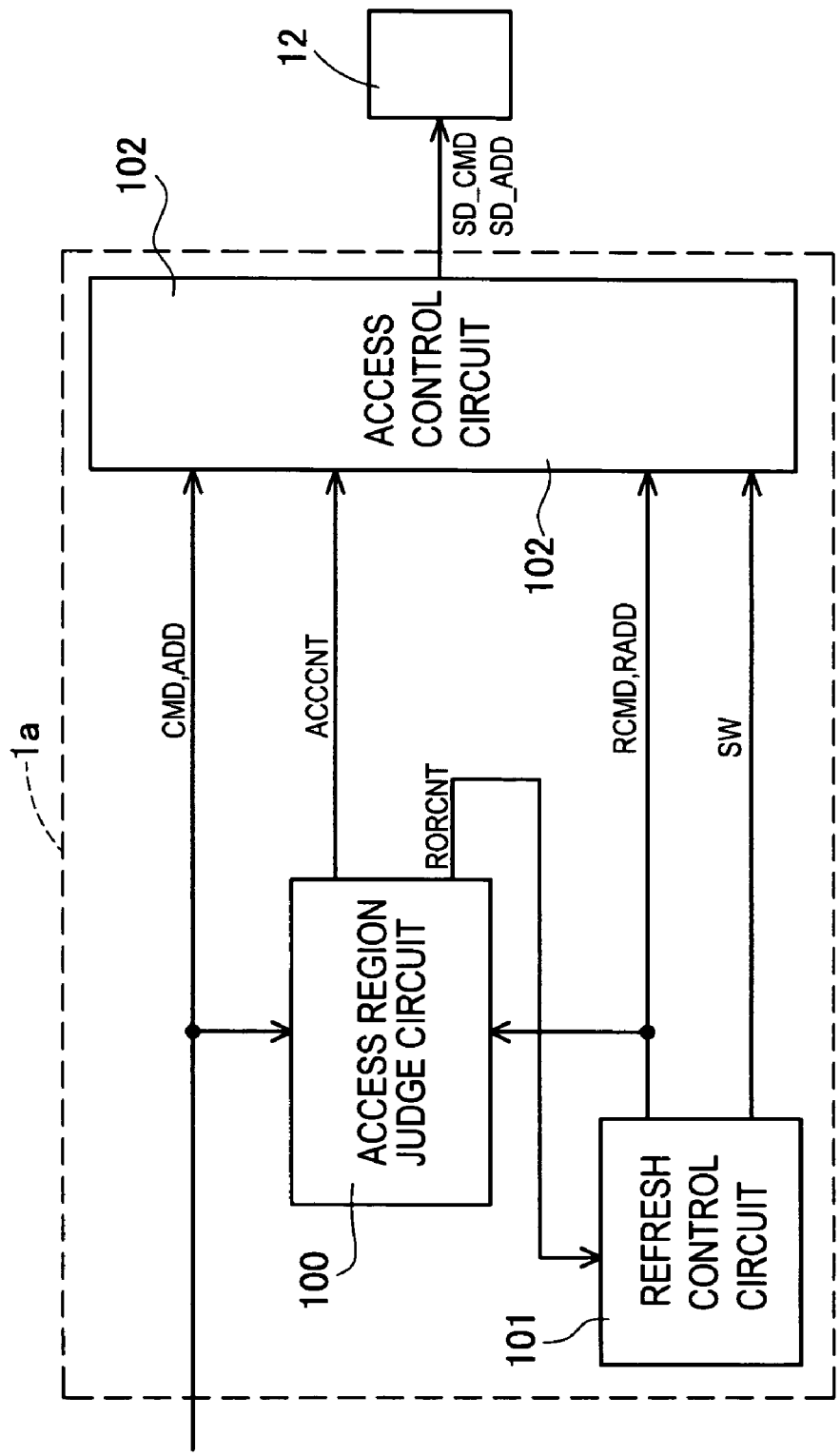
FIG. 9 is a principle diagram of second concept directed to the present invention.

FIG. 9 shows a principle diagram of second concept. A memory control device 1*a* includes an access region judge circuit 100, a refresh control circuit 101, and an access control circuit 102.

An external command CMD and an external address ADD are inputted from a not-shown external CPU or the like to the access control circuit 102. The refresh control circuit 101 generates a refresh command RCMD, a refresh address RADD and a switch signal SW. A refresh command RCMD and a refresh address RADD generated are inputted to the access region judge circuit 100 and the access control circuit 102. A switch signal SW is inputted to the access control circuit 102. An external command CMD and an external address ADD inputted from an external section are inputted to the access region judge circuit 100 and the access control circuit 102. A control command signal SD_CMD and a control address SD_ADD are outputted from the access control circuit 102 to the synchronous-type semiconductor memory device 12. An access control signal ACCCNT outputted from the access region judge circuit 100 is inputted to the access control circuit 102 and a refresh control signal RORCNT is inputted to the refresh control circuit 101. It is to be noted that an access control signal ACCCNT and a refresh control signal RORCNT are an example of first access control signal and a second access control signal.

An external command CMD is a command inputted from an external control section to the memory control device 1*a* in case a read request, a write request and the like are supplied to the synchronous-type semiconductor memory device 12 from a not-shown CPU or the like. An external command CMD is made up by combining commands from an active command ACTV, a read command READ, a write command WRIT, a pre-charge command PRE and the like. For example, a read request is executed by a manner that three kinds of commands, namely, an active command ACTV, a read command READ and a pre-charge command PRE are inputted to the access control circuit 102 in turn with predetermined interval. Here, a period taken for completing operation of a series of commands inputted to execute a requested access operation is defined as data input/output access operation period. For example, as to a read request, a period which begins with an input of an active command signal ACTV to the synchronous-type semiconductor memory device 12, through an input of a pre-charge command PRE to the synchronous-type semiconductor memory device 12, and end with completion of pre-charge operation corresponds to a data input/output access operation period. A command such as an active command ACTV and the like inputted to the access control circuit 102 is converted into a corresponding control command signal SD_CMD (chip select signal /CS, row address strobe signal /RAS, column address strobe signal /CAS, write enable signal /WE) at the access control circuit 102 and then, outputted to the synchronous-type semiconductor memory device 12.

Refresh operation by the memory control device 1*a* will be described. The memory control device 1*a* includes the refresh control circuit 101 from which a refresh command RCMD and a refresh address RADD are outputted to the access control circuit 102. The access control circuit 102 converts a refresh command RCMD and a refresh address RADD into a control command signal SD_CMD and a control address SD_ADD, respectively, and outputs those converted signals to the synchronous-type semiconductor memory device 12. A refresh command RCMD consists of an ROR active command RORACT and an ROR pre-charge command RORPRE. A refresh command RCMD makes the synchronous-type semiconductor memory device 12 execute "RAS only refresh". A period taken for completing operation of a series of refresh commands inputted for executing a requested refresh operation is defined as refresh operation period. For example, a refresh operation period corresponds to a period which begins with an input of an ROR active command RORACT to the synchronous-type semiconductor memory device 12, through an input of an ROR pre-charge command RORPRE to the synchronous-type semiconductor memory device 12, and ends with completion of pre-charge operation. A refresh command and a refresh address are generated in the memory control device 1*a* and supplied to the synchronous-type semiconductor memory device 12, whereby the memory control device 1*a* can freely designate the number of sense amplifiers to be activated concurrently at the synchronous-type semiconductor memory device 12 for refresh operation. That is, the number of sense amplifiers to be activated concurrently is reduced by designation so that a peak value of noises can be reduced.

In case an input of a data input/output access operation period for an external command CMD and an input of a refresh operation period of a refresh command RCMD overlap and an access region for the data input/output access operation period and an access region for the refresh operation period are different, the access control circuit 102 can execute parallel conversion processing operation wherein respective commands such as an active command ACTV, a read command READ, a pre-charge command PRE, and the like which constitute an external command CMD and respective commands such as an ROR active command RORACT, and an ROR pre-charge command RORPRE which constitute a refresh command RCMD are converted into control commands SD_CMD and outputted. On the other hand, in case an input of a data input/output access operation period for an external command CMD and an input of a refresh operation period of a refresh command RCMD overlap and an access region for the data input/output access operation period and an access region for the refresh operation period coincide with each other, parallel conversion processing is prohibited. That is, until an operation period for a command inputted earlier than other command terminates, an input of a posterior command (other command) to the synchronous-type semiconductor memory device 12 is prohibited.

Sequence of the parallel conversion processing operation will be described. In case a data input/output access operation period for an external command CMD comes earlier than a refresh operation period of a refresh command RCMD, inputs of those periods overlap, and access regions for those period coincide with each other, outputs of a refresh command RCMD, a refresh address RADD, and a switch signal SW are prohibited until the data input/output access operation period for an external command CMD terminates. A refresh control signal RORCNT informs the refresh control circuit 101 whether or not a refresh operation is prohibited. In case a refresh operation period of a refresh command RCMD comes earlier than a data input/output access operation period for an external command CMD, inputs of those periods overlap, and access regions for those period coincide with each other, outputs of an external command CMD and an external address ADD to the synchronous-type semiconductor memory device are prohibited until the refresh operation period of a refresh command RCMD terminates. An access control signal ACCCNT informs the access control circuit 102 of the prohibition.

Thereby, an operation by an external command CMD and a refresh operation can be done in parallel even though the number of sense amplifiers to be activated concurrently is reduced during refresh operation so as to increase refresh frequency. Therefore, overhead time for refresh does not increase and access operation can be prevented from delaying.

Figure 10:
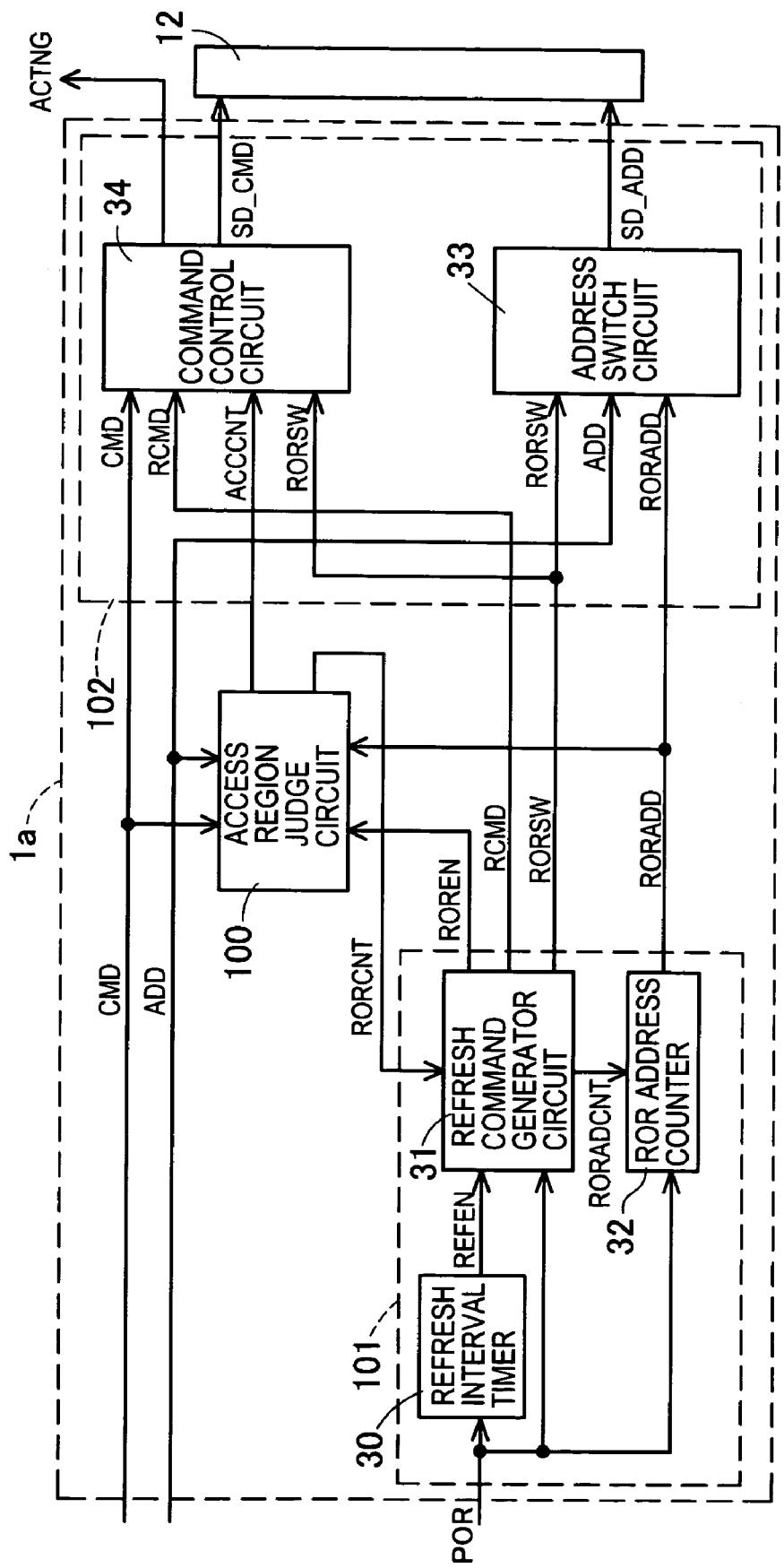
FIG. 10 is a circuit structure diagram a memory control device 1a directed to a first embodiment.

A first embodiment directed to the second principle diagram of the present invention will be described by referring to FIG. 10 through FIG. 20. FIG. 10 shows a circuit structure diagram of a memory control device 1a directed to the first embodiment. The memory control device 1a includes an access region judge circuit 100, a refresh control circuit 101 and an access control circuit 102. The refresh control circuit 101 consists of a refresh interval timer 30, a refresh command generator circuit 31 and an ROR address counter 32. The access control circuit 102 consists of a command control circuit 34 and an address switch circuit 33. An external command CMD, an access control signal ACCCNT, a switch signal RORSW, and a refresh command RCMD are inputted to the command control circuit 34. A refresh command RCMD consists of an ROR active command RORACT and an ROR pre-charge command RORPRE. The command control circuit 34 converts an inputted external command CMD into a control command signal SD_CMD and output the converted signal to the synchronous-type semiconductor memory device 12. In case access is not allowed and a control command signal SD_CMD cannot be outputted despite that an external command CMD has been inputted, the command control circuit 34 outputs an access-no-good signal ACTNG to a not-shown CPU. Furthermore, an ROR address RORADD, an external address ADD, and a switch signal RORSW are inputted to the address switch circuit 33 from which a control address SD_ADD is outputted to the synchronous-type semiconductor memory device 12.

A power on reset signal POR outputted from a not-shown circuit is inputted to the refresh interval timer 30 in the refresh control circuit 101. A refresh enable signal REFEN is outputted from the refresh interval timer 30. A refresh enable signal REFEN, a power on reset signal POR, and a refresh control signal RORCNT are inputted to the refresh command generator circuit 31. An ROR enable signal ROREN, a switch signal RORSW, a refresh command RCMD and a signal RORADCNT are outputted from the refresh command generator circuit 31. An ROR enable signal ROREN is inputted to the access region judge circuit 100. A switch signal RORSW is inputted to the address switch circuit 33 and the command control circuit 34. A refresh command RCMD is inputted to the command control circuit 34. A signal RORADCNT is inputted to the ROR address counter 32. An ROR address count signal RORADCNT and a power on reset signal POR are inputted to the ROR address counter 32. The ROR address counter 32 outputs an ROR address RORADD to the address switch circuit 33 and the access region judge circuit 100. An ROR address RORADD, an external address ADD, an ROR enable signal ROREN, and an external command CMD are inputted to the access region judge circuit 100. A refresh control signal RORCNT and an access control signal ACCCNT are outputted from the access region judge circuit 100. An ROR address RORADD includes an ROR bank address RORBA, and an external address ADD includes an external bank address BA.

Structure and function of the refresh interval timer 30 will be described. The refresh interval timer 30 is a circuit which outputs a refresh enable signal REFEN to the refresh command generator circuit 31 by predetermined cycle. The refresh interval timer 30 includes an oscillator and a counter, and a power on reset signal POR is inputted there. A power on reset signal POR is a signal which is set in high level at the time of power-ON and level of the signal shifts to low level when power voltage rises up to a predetermined value. In case a power on reset signal POR in low level is inputted to the refresh interval timer 30 after power-ON, the oscillator starts oscillation and a refresh enable signal REFEN is outputted every predetermined cycle by dividing oscillation with the counter. A predetermined cycle is 16 (μs) per cycle, and the like. The refresh command generator circuit 31 outputs a refresh command RCMD basing on a refresh enable signal REFEN. In the synchronous-type semiconductor memory device 12, a refresh operation is executed in response to an input of a refresh command RCMD which is converted into a control command signal SD_CMD through the command control circuit 34.

Figure 11:
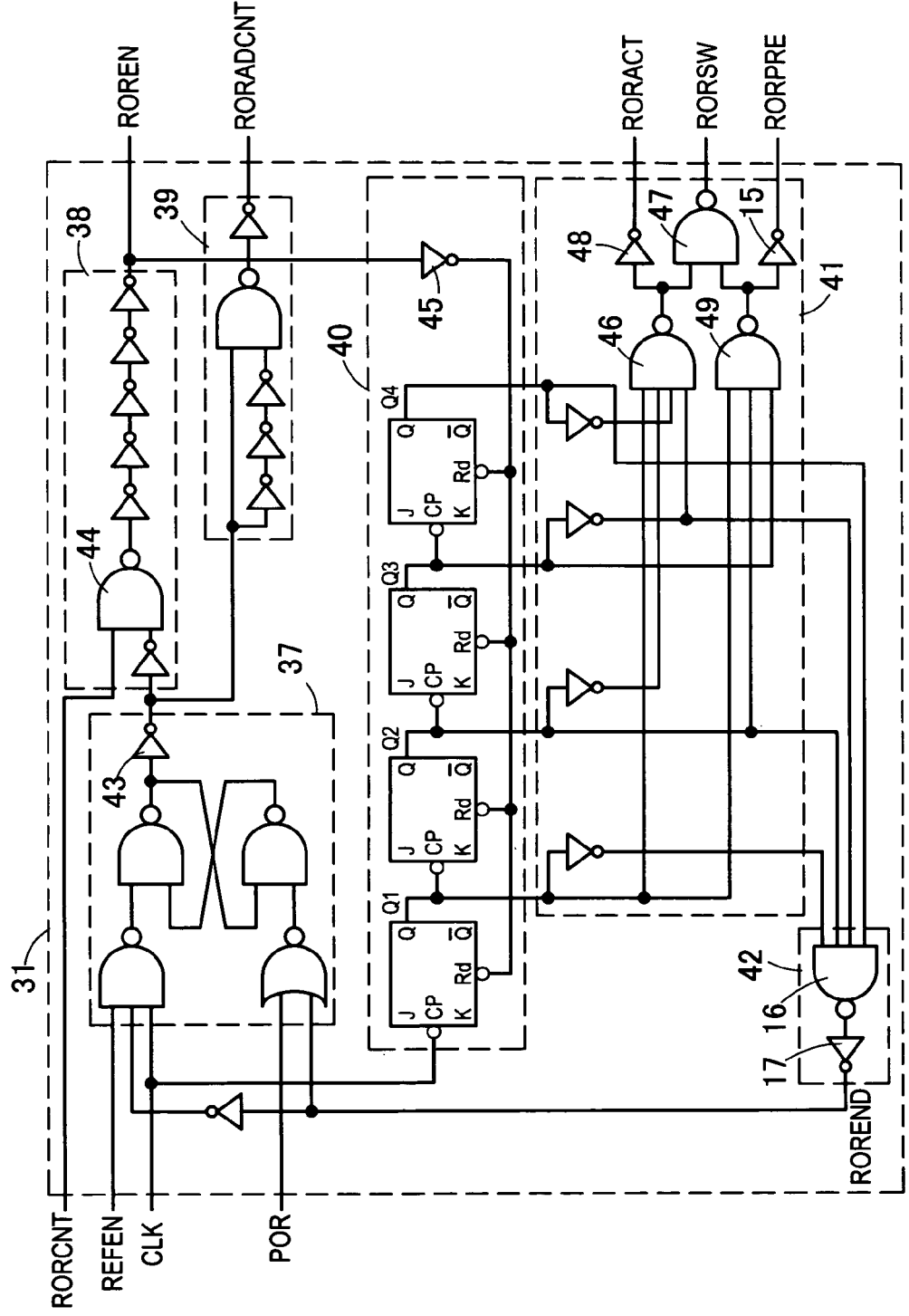
FIG. 11 is a circuit diagram of a command generator circuit 31.
Figure 12:
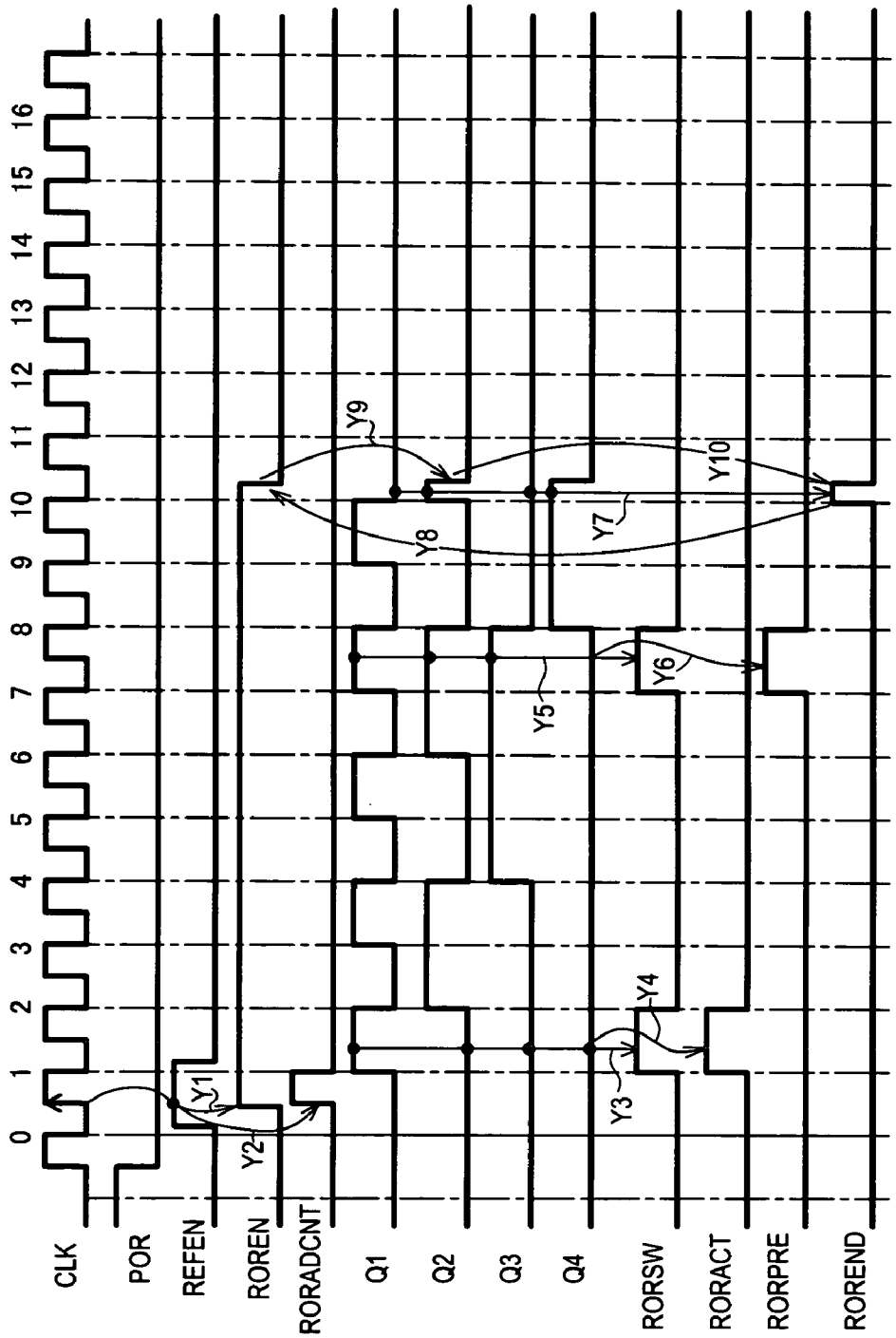
FIG. 12 shows an operational diagram of the command generator circuit 31.

Structure and function of the refresh command generator circuit 31 will be described. FIG. 11 shows a circuit diagram of the refresh command generator circuit 31 and FIG. 12 shows operational waveform of the refresh command generator circuit 31. As shown in FIG. 11, the refresh command generator circuit 31 includes an input section 37, signal output sections 38, 41, a pulse signal generator section 39, a counter section 40, and an ROREND signal generator section 42. A refresh enable signal REFEN, a refresh control signal RORCNT, and an external clock CLK are inputted to the refresh command generator circuit 31 and an ROR enable signal ROREN, an ROR address count signal RORADCNT, and an ROR active command RORACT, an ROR pre-charge command PORPRE and a switch signal RPRSW are outputted from there.

The counter section 40 is structured by connecting four JK flip-flops in series wherein high-level signals are inputted to respective JK terminals constantly. That is, the counter section 40 works as a binary counter which handles four-bit data. In FIG. 12, in case a refresh enable signal REFEN in high level outputted from the refresh interval timer 30 is inputted to an input section 37 after a predetermined time passes since power-ON and a power on reset signal POR is set in low level, level of an output from an inverter 43 shifts from high level to low level along with a rising edge of an external clock CLK. In case a refresh control signal RORCNT in high level outputted from the access region judge circuit 100 is inputted to a signal output section 38, level of an output from a NAND gate 44 in the signal output section 38 shifts to low level and an ROR enable signal ROREN is set in high level through odd-numbered inverters (FIG. 12, arrow Y1). Furthermore, when level of an output from the inverter 43 shifts from high level to low level, an ROR address count signal RORADCNT, a high-level pulse signal, is outputted from a pulse signal generator section 39 (FIG. 12, arrow Y2).

When ROR enable signals ROREN level of which is inverted to low level by the inverter 45 in the counter section 40 are inputted to read terminals Rd of respective JK flip-flops, the counter section 40 starts a count operation along with a falling edge of an external clock CLK. When outputs Q1 through Q4 from respective JK flip-flops are set as Q1=H (high level), Q2=L (low level), Q3=L, and Q4=L, level of an output from a NAND gate 46 shifts from high level to low level and a switch signal RORSW in high level is outputted from a NAND gate 47 (FIG. 12, arrow Y3). Furthermore, level of an output from the NAND gate 46 is inverted to high level by an inverter 48 and outputted as an ROR active command RORACT (arrow Y4). Similarly, when outputs Q1 through Q3 from respective JK flip-flops are set as Q1=H, Q2=H, and Q3=H along with an rising edge of a seventh clock since the counter section 40 starts operation, level of an output from the NAND gate 49 shifts from high level to low level and a switch signal RORSW in high level is outputted from the NAND gate 47 (arrow Y5). An output from the NAND gate 49 is inverted to high level by the inverter 15 and outputted as an ROR pre-charge command RORPRE (arrow Y6).

When outputs Q1 through Q4 from respective JK flip-flops are set as Q1=L, Q2=H, Q3=L and Q4=H along with an rising edge of a tenth clock since the counter section 40 starts operation, level of an output from a NAND gate 16 in an ROREND signal generator section 42 shifts from high level to low level. Therefore, level of a signal ROREND, an output from an inverter 17, shifts from low level to high level (arrow Y7). Since level of an output from the input section 37 shifts from low level to high level when level of a signal ROREND shifts to high level, an ROR enable signal ROREN is set in low level (arrow Y8). When level of an ROR enable signal ROREN is set in low level, signals in high level are inputted to read terminals Rd of respective flip-flops in the counter section 40 and outputs Q1 through Q4 are reset to low level (arrow Y9) and a signal ROREND is also set in low level in response to reset of the counter section 40 (arrow Y10).

Figure 13:
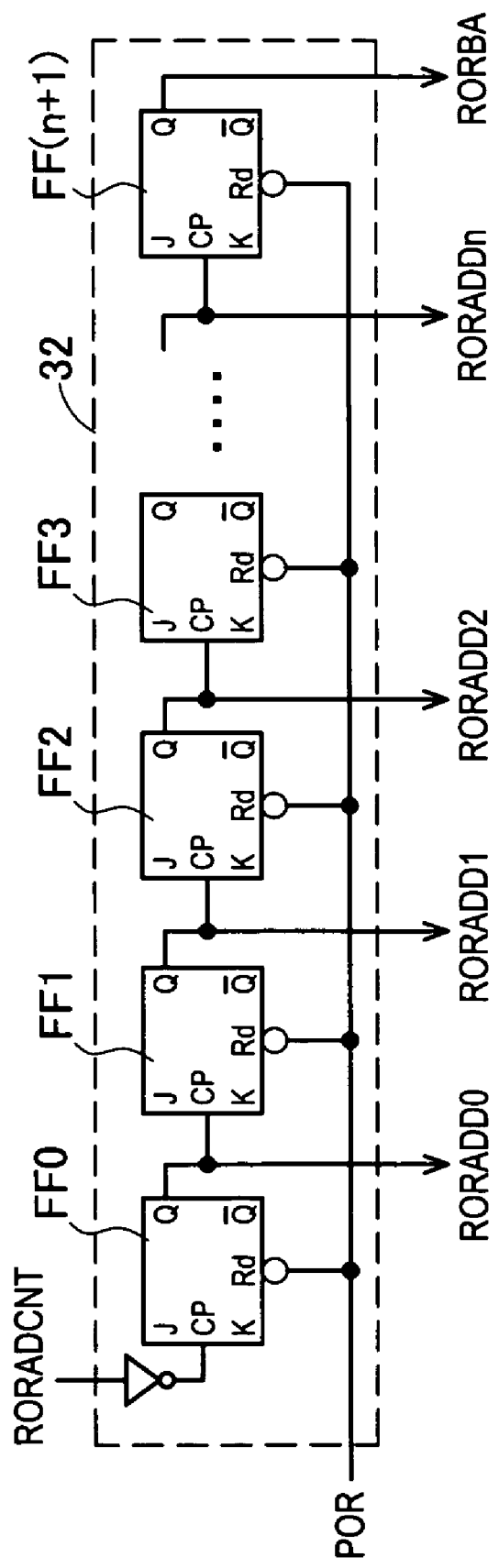
FIG. 13 is a circuit structure diagram of an ROR address counter 32.

Structure of the ROR address counter 32 will be described by referring to FIG. 13. The ROR address counter 32 is structured by connecting JK flip-flops FF0 through FF(n+1) in series wherein high level signals are inputted to JK terminals constantly. That is, the ROR address counter section 32 works as a binary counter which handles (n+1)-bit data. Power on reset signals POR are inputted for reading terminals Rd of respective JK flip-flops. An output from the flip-flop FF(n+1) corresponds to an ROR bank address RORBA. Outputs from the flip-flops FF0 through FFn constitute bit columns RORADD0 through RORADDn of ROR address RORADD. A signal RORADCNT outputted from the refresh command generator circuit 31 is inputted to a clock terminal CP of the flip-flop FF0. Thereby, the ROR address RORAD is renewed every time one-pulse signal RORADCNT is inputted to the ROR address counter 32.

Figure 14:
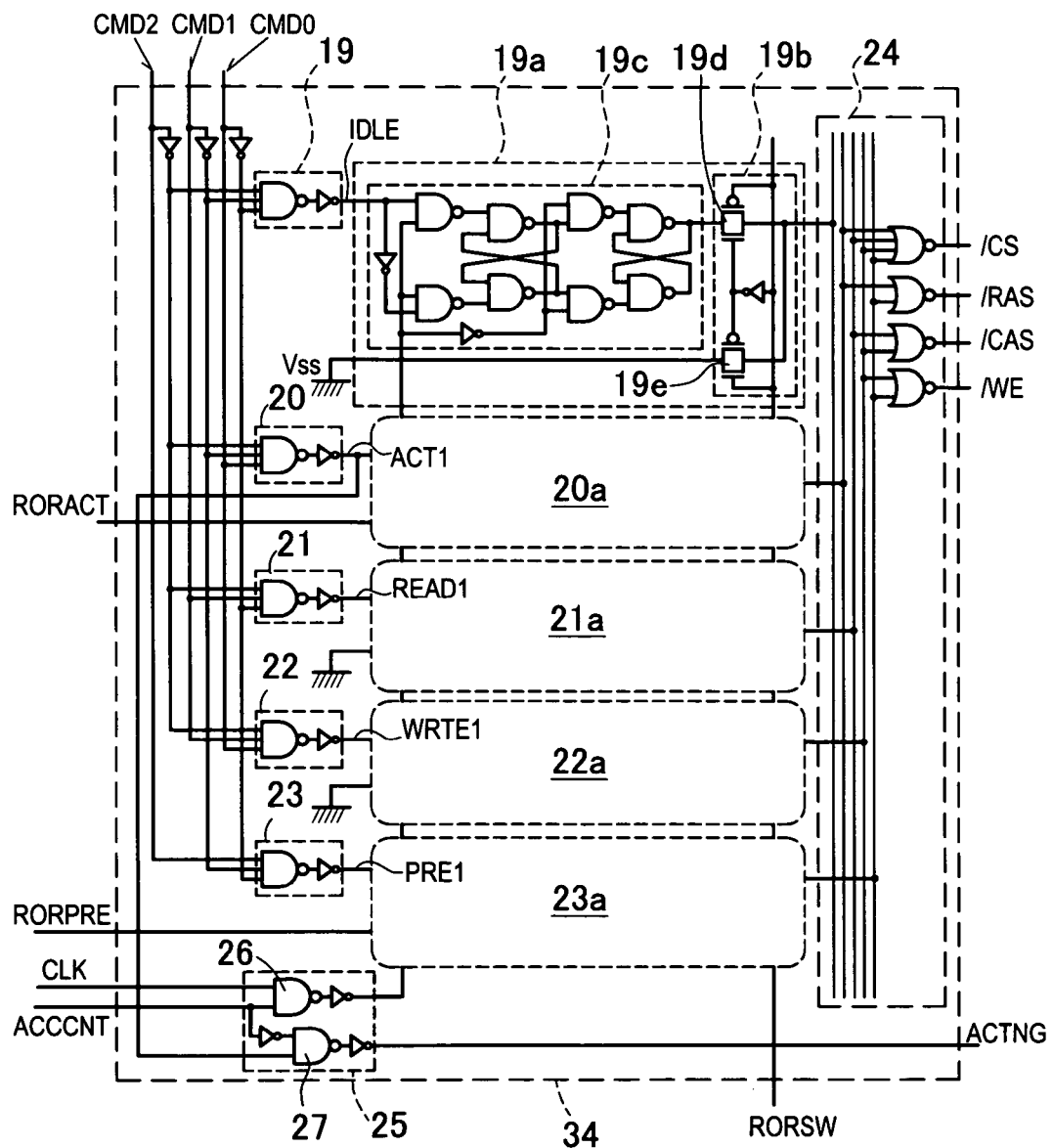
FIG. 14 is a circuit structure diagram of a command control circuit 34.

Structure and function of the command control circuit 34 will be described by referring to FIG. 14 and FIG. 15. The command control circuit 34 includes decode sections 19 through 23 output ends of which are connected to a second decode section 24 through command control sections 19a through 23a. The command control section 19a includes a switch section 19b, and an output from a master-slave flip-flop section 19c and ground voltage Vss are inputted to a switch section 19b. Command control sections 20a through 23a are structured same as the command control section 19a. However, instead of ground voltage Vss, an ROR active command RORACT and an ROR pre-charge command PORPRE are inputted to the command control section 20a and the command control section 23a, respectively. An access control signal ACCCNT and an external clock CLK generated at the access region judge circuit 100, and an active command ACTV corresponding to an output from the decode section 20 are inputted to the access control section 25. An access control signal ACCNT and an external clock CLK are inputted to a NAND gate 26 and outputs from the NAND gate 26 are inverted through an inverter and finally inputted to input control sections of respective master-slave flip-flop sections of the command control sections 19a through 23a. Switch signals RORSW are inputted to the command control sections 19a through 23a. External commands CMD each of which consists of three bit columns, namely, a signal CMD0, a signal CMD1, and a signal CMD2, are inputted to the decode sections 19 through 23.

The command control circuit 34 is a circuit which selects an external command CMD or a refresh command depending on a switch signal RORSW inputted from the refresh command generator circuit 31 and outputs a selected signal to the synchronous-type semiconductor memory device 12. That is, when a switch signal RORSW is in low level, an external command CMD is decoded into a control command signal SD_CMD and outputted to the synchronous-type semiconductor memory device 12. On the other hand, when a switch signal RORSW is in high-level, a refresh command RCMD (ROR active command RORACT and ROR pre-charge command RORPRE) inputted from the refresh command generator circuit 31 is decoded into a control command signal SD_CMD and outputted to the synchronous-type semiconductor memory device 12. As to operation of the command control section 19a, when a switch signal RORSW is in low level, the switch 19d is set in conductive state and the switch 19e is set in non-conductive state, an output from the master-slave flip-flop section 19c is outputted to the second decode section 24. Vice versa, when a switch signal RORSW is in high level, the switch 19d is set in non-conductive state and the switch 19e is set in conductive state, ground voltage Vss is outputted to the second decode section 24. The command control sections 20a through 23a are operated similarly.

When an access control signal ACCCNT generated from the access region judge circuit 100 is in high level (accessible), the command control circuit 34 decodes a to-be-inputted external command CMD to a control command signal SD_CMD and then, outputs the control command signal SD_CMD to the synchronous-type semiconductor memory device 12. When an access control signal ACCCNT is in low level (not-accessible), the command control circuit 34 blocks to prevent an external command from being transmitted to the synchronous-type semiconductor memory device 12.

In case, an access region in a synchronous-type semiconductor memory device accessed by an external command CMD gets access and an access region in the synchronous-type semiconductor memory device accessed by a refresh operation coincide with each other and the refresh operation has been done before access operation by the external command CMD, an access control signal ACCCNT in low level, which indicates access of the external command signal CMD is impossible, is inputted to the NAND gate 26 in the access control section 25. In response to an input of an access control signal ACCCNT, an output from the access control section 25 is constantly kept in low level. Since inputs to flip-flops at the master side of the master-slave flip-flop section for the command control sections 19a through 23a are set in high level, outputs from the decode sections 19 through 23 are not transmitted to the second decode section 24 through the command control sections 19a through 23a. Level of an access control signal ACCCNT is inverted from low level to high level by an inverter and the level-inverted access control signal ACCCNT is inputted to the NAND gate 27. Therefore, in case an external CPU or the like tries to access to the synchronous-type semiconductor memory device 12 during a not-accessible period, an active signal ACT1 in high level is inputted to the NAND gate 27 and an access no good signal ACTNG inverted to high level through an inverter is outputted from the access control section 25. The access no good signal ACTNG is inputted to a not-shown CPU and the like and failure of access to the synchronous-type semiconductor memory device 12 is informed. The CPU conducts an access operation again when a refresh operation to be conducted after lapse of a predetermined time terminates.

In case, an access region in a synchronous-type semiconductor memory device accessed by an external command CMD gets access and an access region in the synchronous-type semiconductor memory device accessed by a refresh operation do not coincide, an access control signal ACCCNT in high level, which indicates access of the external command signal CMD is possible, is inputted to the NAND gate 26 in the access control section 25. Then, signals of which waveform is similar to an external clock CLK are inputted from the access control section 25 to the command control sections 19a though 23a. Therefore, when outputs from the access control section 25 are in high level, outputs from the decode sections 19 through 23 are fetched to the master side of the master-slave flip-flop section, the fetched signal is transmitted to the slave side of the master-slave flip-flop section while an output from the access control section 25 is in low level and subsequently, outputted to the second decode section 24. The outputs from the decode sections 19 through 23 are thus transmitted to the second decode section 24.

Therefore, when a switch signal RORSW is in low level and an access control signal ACCCNT is in high level (accessible), upon an input of an external command CMD consisting of predetermined bit columns CMD0, CMD1, and CMD2 shown in FIG. 15, a high-level signal is outputted from a decode section out of the decode sections 19 through 23 according to a content of an external command CMD and transmitted to the second decode section 24. When an idle command IDLE, an active command ACTV, a read command READ, a write command WRIT, a pre-charge command PRE are inputted, the second decode section 24 decodes and outputs a chip select signal /CS, a row address strobe signal /RAS, a column address strobe signal /CAS, and a write enable signal /WE corresponding to respective commands, as shown in FIG. 15.

Structure and function of the address switch circuit 33 will be described. The address switch circuit 33 is a circuit which selectively outputs an ROR address RORADD or an external address ADD to the synchronous-type semiconductor memory device 12, as control address SD_ADD in accordance with a switch signal RORSW. In case a switch signal RORSW is in low level, an external address ADD is outputted as control address SD_ADD and in case a switch signal RORSW is in high level, an ROR address RORADD is outputted as control address SD_ADD.

Figure 16:
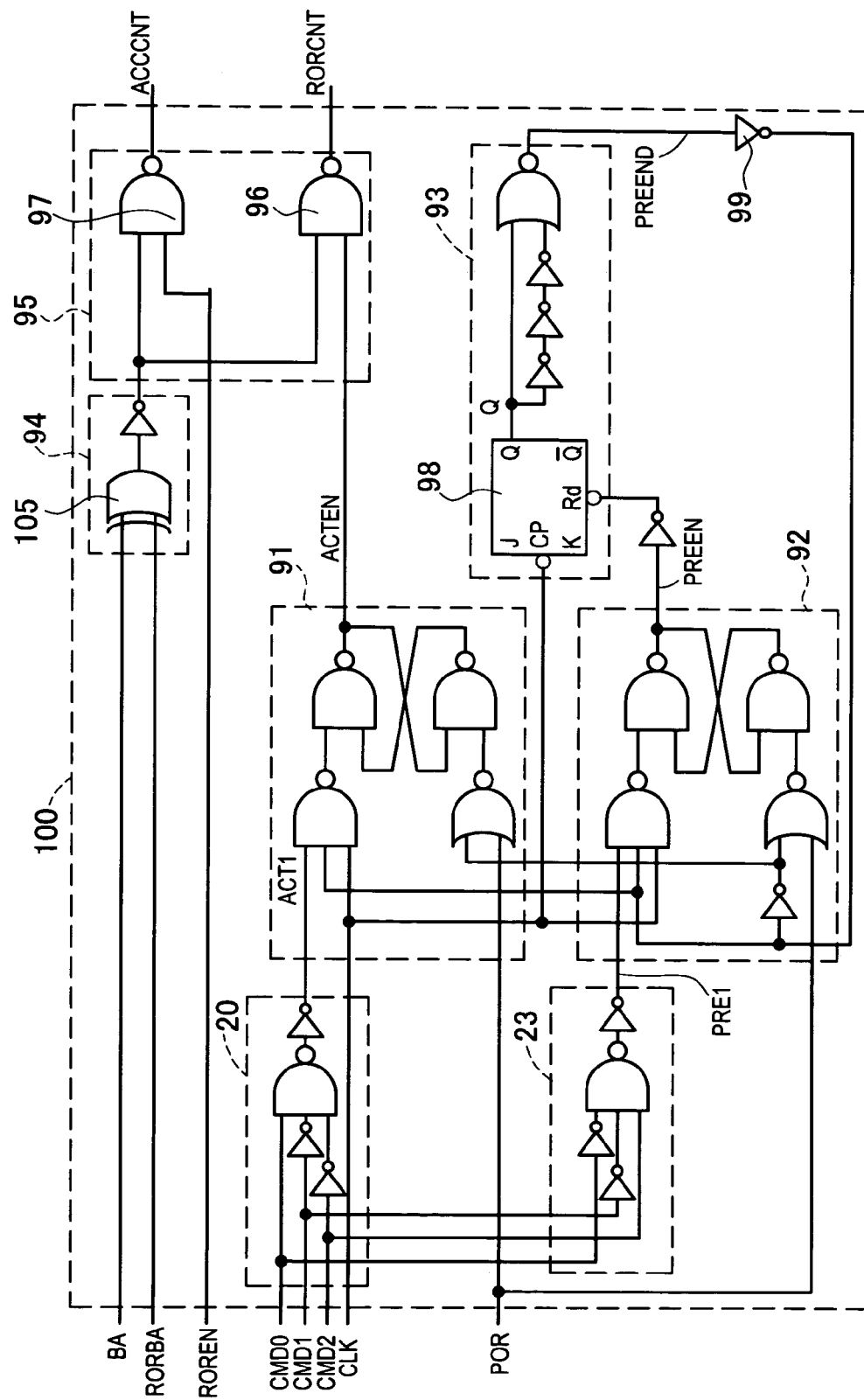
FIG. 16 shows a circuit structure diagram of an access region judge circuit 100.

Structure of the access region judge circuit 100 will be described by referring to FIG. 16. The access region judge circuit 100 includes an active command decode section 20, a pre-charge command decode section 23, flip-flop sections 91 and 92, a pre-charge end signal section 93, a coincidence judge section 94, and an output section 95. An external bank address BA, and an ROR bank address RORBA are inputted to the coincidence judge section 94 and an output from the coincidence judge section 94 is inputted to the output section 95. An external clock CLK, a power on reset signal POR, a pre-charge end signal PREEND inverted by an inverter 99, and an active signal ACT1 corresponding to an output from the active command decode section 20 are inputted to the flip-flop section 91. An output from the flip-flop section 91 is inputted to the output section 95 as active enable signal ACTEN. An access control signal ACCCNT and refresh control signal RORCNT are outputted from the output section 95. An external clock CLK, a power on reset signal POR, a pre-charge signal PREEND inverted by the inverter 99, and a pre-charge signal PRE1 corresponding to an output from the pre-charge command decode section 23 are inputted to the flip-flop section 92. An output from the flip-flop section 92 is inputted to the pre-charge end signal section 93 as pre-charge enable signal PREEN through an inverter. A pre-charge enable signal PREEN and an external clock CLK are inputted to the pre-charge end signal section 93 and a pre-charge end signal PREEND is outputted from there.

Figure 17:
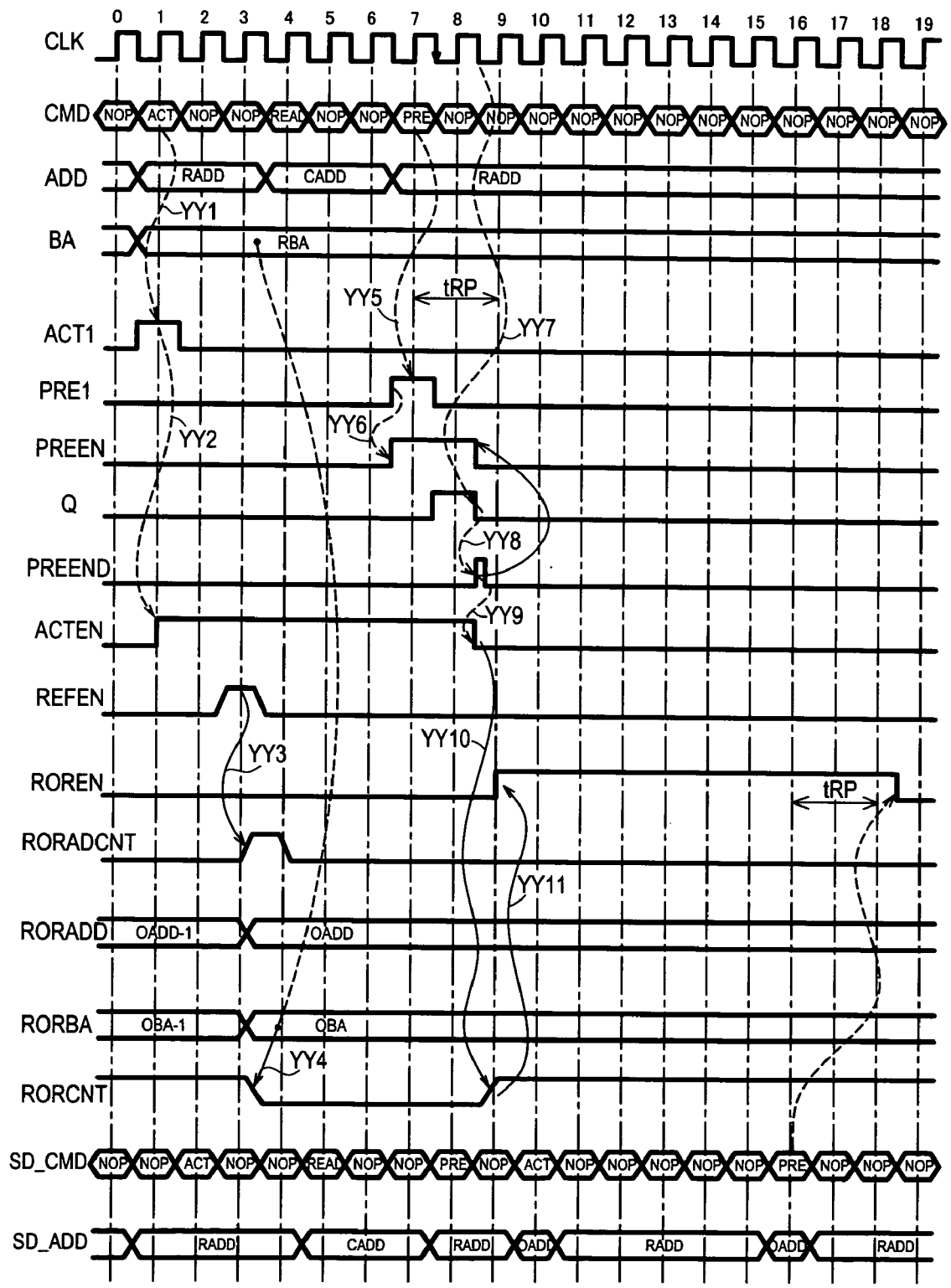
FIG. 17 shows operational waveform of the memory control device 1a obtained in case of operation (A)

Operation of the access region judge circuit 100 and entire operation of the memory control device will be described by referring to FIG. 16 and FIG. 17. Description will be sectioned into the following four conditions (A) through (D): (A) a data input/output access operation period of an external command CMD comes earlier than a refresh operation period of a refresh command RCMD and an access region of the external command CMD and that of the refresh command RCMD coincide with each other provided that both of the commands are inputted simultaneously; (B) a data input/output access operation period of an external command CMD comes earlier than a refresh operation period of a refresh command RCMD and an access region of the external command CMD and that of the refresh command RCMD do not coincide with each other provided that both of the commands are inputted simultaneously; (C) a refresh operation period of a refresh command RCMD comes earlier than a data input/output access operation period of an external command CMD and an access region of the refresh command RCMD and that of the external command CMD coincide with each other provided that both of the commands are inputted simultaneously; and (D) a refresh operation period of a refresh command RCMD comes earlier than a data input/output access operation period of an external command CMD and an access region of the refresh command RCMD and that of the external command CMD do not coincide with each other provided that both of the commands are inputted simultaneously.

Operation of the access region judge circuit 100 under the condition (A) will be described by referring to FIG. 16 and FIG. 17. When an active command ACTV, which is a combination among signals CMD0 through CMD2 shown in FIG. 15 as external command CMD, is inputted to the active command decode section 20 in the access region judge circuit 100, an active signal ACT1 in high level is outputted (arrow YY1). When the active signal ACT1 in high level is inputted to the flip-flop section 91, an active enable signal ACTEN corresponding to an output signal from the flip-flop section 91 is inverted to high level along with a rising edge of an external clock CLK (arrow YY2). While an active enable signal ACTEN is in high level, an access operation of an external command CMD is conducted in the synchronous-type semiconductor memory device 12. Here will be described a case that a refresh command RCMD is outputted from the refresh command generator circuit 31 to request a refresh operation during an access operation period in accordance with an external command CMD (a period in which an active enable signal ACTEN is in high level).

When a refresh enable signal REFEN, a high-level pulse signal, is inputted from the refresh interval timer 30 to the refresh command generator circuit 31, an ROR address count signal RORADCNT, a high-level pulse signal, is outputted from the refresh command generator circuit 31 to the ROR address counter 32 and the ROR address RORADD is counted up at the ROR address counter 32 (arrow YY3). The ROR address RORADD after counted up and an external address ADD are inputted to the address region judge circuit 100 and then, coincidence judgment, i.e., judgment whether or not an ROR bank address RORBA included in an ROR address RORADD and an external bank address BA included in an external address ADD coincide, is conducted at the coincidence judge section 94 (FIG. 16). Since both of the bank addresses coincide with each other, an output from an exclusive OR gate 105 is in low level and a signal level of which is inverted to high level is inputted from the coincidence judge section 94 in the output section 95. Since a high-level output signal from the coincidence judge section 94 and active enable signal ACTEN in high level are inputted to the NAND gate 96 in the output section 95, a refresh control signal RORCNT, an output from the NAND gate 96, is set in low level (FIG. 17, arrow YY4). A refresh control signal RORCNT in low level (corresponding to prohibition of a refresh operation) is inputted to the NAND gate 44 (FIG. 11) of the signal output section 38 in the refresh command generator circuit 31. Thereby, an ROR enable signal ROREN, an output from the signal output section 38 is also set in low level (corresponding to prohibition of a refresh operation).

Since a read operation is requested from the external control section, an external command CMD for a read operation and a pre-charge operation is inputted. When a pre-charge command PRE in high level is outputted to the pre-charge command decode section 23 (FIG. 16) in the access region judge circuit 100 as an external command CMD, a pre-charge signal PRE1 in high level is outputted (arrow YY5). When a pre-charge signal PRE1 in high level is inputted to the flip-flop section 92, a pre-charge enable signal PREEN, an output from the flip-flop section 92, is set in high level (arrow YY6). Level of the pre-charge enable signal PREEN is inverted from high level to low level through an inverter and the level-inverted the pre-charge enable signal PREEN is further inputted to a ready terminal Rd of the flip-flop 98 in the pre-charge end signal section 93, whereby an operation of the flip-flop 98 is started. When an output Q from the flip-flop section 98 is set in low level along with a falling edge of a second clock since a pre-charge enable signal PREEN is set in high level (arrow YY7), a pre-charge end signal PREEND, a high-level pulse signal, is outputted from the pre-charge end signal section 93 (arrow YY8), and the pre-charge end signal PREEND level of which is inverted to low level through the inverter 99 is further inverted and inputted to the NOR gates of the flip-flop sections 91 and 92. Therefore, an active enable signal ACTEN, an output from the flip-flop section 91, is set in low level (arrow YY9). Thereby, a read operation terminates. It should be noted that the two-clock period is a period required for terminating a pre-charge operation and defined as a pre-charge time tRP.

When an active enable signal ACTEN is set in low level, a refresh control signal RORCNT in high level is outputted from the NAND gate 96 in the output section 95 (arrow YY10). Furthermore, when a refresh control signal RORCNT in high level is inputted to the signal output section 38 (FIG. 11) in the refresh command generator circuit 31, an ROR enable signal ROREN is set in high level (arrow YY11). This means that a data input/output access operation period of an external command CMD for a read operation terminates and a refresh operation is allowed. The ROR enable signal ROREN in high level is inverted to low level through the inverter 45 in the counter section 40 and then, inputted to read terminals Rd of respective JK flip-flops. Therefore, the counter section 40 starts a counter operation along with a falling edge of an external clock CLK. In accordance with an operation of the counter section 40, a refresh command RCMD (ROR active command RORACT and ROR pre-charge command RORPRE) is outputted from the refresh command generator circuit 31.

Thereby, in case a data input/output access operation period of an external command CMD comes earlier than a refresh operation period of a refresh command RCMD and an access region of the external command CMD and that of the refresh command RCMD coincide with each other provided that both of the commands are inputted simultaneously, the memory control device 1a controls operation such that an await operation (a refresh command RCMD is not outputted from the refresh command generator circuit 31) is executed until a data input/output access operation period of an external command CMD terminates whereas an output operation of a refresh command RCMD is started when a data input/output access operation period of an external command CMD terminates.

Figure 18:
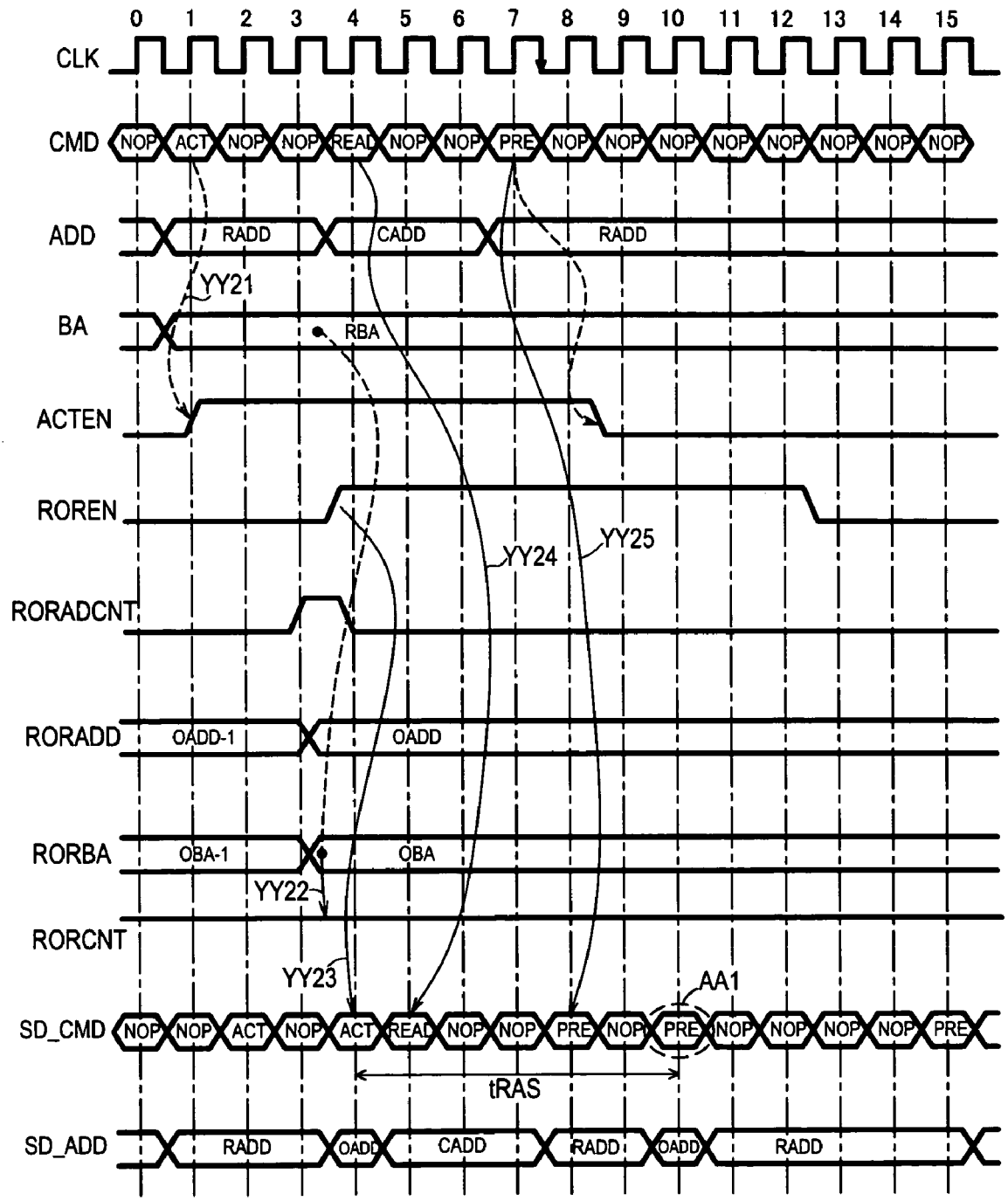
FIG. 18 shows operational waveform of the memory control device 1a obtained in case of operation (B)

Operation of the access region judge circuit 100 under the condition (B) will be described by referring to FIG. 16 and FIG. 18. When an active command ACTV is inputted to the active command decode section 20 in the access region judge circuit 100 as external command CMD, an active enable signal ACTEN is set in high level (arrow YY21). In case a refresh operation is requested from the refresh interval timer 30 while an active enable signal ACTEN is in high level (a period that an access operation in accordance with an external command CMD is being executed in the synchronous-type semiconductor memory device 12), an ROR address count signal RORADCNT is inputted from the refresh command generator circuit 31 to the ROR address counter 32 and an ROR address RORADD is counted up by the ROR address counter 32. An ROR address RORADD after counted up and an external address ADD are inputted to the access region judge circuit 100, whereby coincidence judgment, i.e., judgment whether or not an ROR bank address RORBA included in an ROR address RORADD and an external bank address BA included in an external address ADD coincide, is conducted at the coincidence judge section 94 (FIG. 16). Under the condition (B), the above those bank addresses do not coincide with each other. Therefore, a refresh control signal RORCNT, an output from the output section 95, is kept in high level (a refresh operation is allowed), (arrow YY22). Since a refresh control signal RORCNT in high level is inputted to the NAND gate 44 (FIG. 11) of the signal output section 38 in the refresh command generator circuit 31, an ROR enable signal ROREN, an output from the signal output section 38, is set in high level. That is, an ROR enable signal ROREN is treated as a high level signal for permitting refresh operation.

An ROR enable signal ROREN level of which is inverted from high level to low level through the inverter 45 in the counter section 40 and inputted to ready terminals Rd of respective JK flip-flops. Subsequently, the counter section 40 starts a count operation along with a falling edge of an external clock CLK, and subsequently, an ROR active command RORACT and a switch signal RORSW, both of which are high-level pulse signals, are outputted within a same clock period (FIG. 12, arrow Y3 and arrow Y4). Next, a switch signal RORSW in high level and an ROR active command RORACT are inputted to the command control section 20a in the command control circuit 34 (FIG. 14) within a same clock. Furthermore, an input of a switch signal RORSW in high level makes the switch section switch so as to connect a signal line of an ROR active command RORACT to the second decode section 24, whereby the ROR active command RORACT is inputted to the second decode section 24. The second decode section 24 converts an ROR active command RORACT into a control command signal SD_CMD for active request and outputs the control command signal SD_CMD (arrow YY23).

When a switch signal RORSW, a one-clock cycled high-level signal, is inputted to the address switch circuit 33, the address switch circuit 33 outputs an ROR address RORADD, which is inputted from the ROR address counter 32 while a switch signal RORSW is in high level, to the synchronous-type semiconductor memory device 12 as control address SD_ADD.

There will be described a switch operation at the command control circuit 34 (FIG. 14) in case a read command READ is inputted as external command after an input of a refresh command RCMD. When a read command READ is inputted to the decode section 21, a read signal READ1 in high level is outputted. Therefore, a switch signal RORSW in low level and a read signal READ1 in high level inputted from the decode section 21 are inputted to the command control section 21a in the command control circuit 34. The switch signal RORSW in low level makes the switch section switch so that a read signal READ1 is inputted to the second decode section 24. When the read signal READ1 is inputted to the second decode section 24, the second decode section 24 converts a read signal READ1 into a control command signal SD_CMD for read request and outputs the control command signal SD_CMD to the synchronous-type semiconductor memory device 12 (arrow YY24).

When a pre-charge command PRE is inputted to the memory control device 1a as external command CMD so as to terminate a read request, inverted into a control command SD_CMD, and inputted to the synchronous-type semiconductor memory device 12 (arrow YY25), a data input/output access operation period of an external command CMD terminates. A switch signal RORSW in high level and an ROR pre-charge command RORPRE in high level are outputted from the refresh command generator circuit 31 along with a rising edge of a seventh clock since the counter section 40 starts operation (FIG. 12, arrow Y5, arrow Y6). A six-clock cycle time which begins with an output of an ROR active command RORACT and ends with an output of an ROR pre-charge command RORPRE is defined as time tRAS.

When a switch signal RORSW and an ROR pre-charge command RORPRE both in high level are inputted to the command control section 23a in the command control circuit 34 (FIG. 14) within a same clock, an ROR pre-charge command RORPRE is inputted to the second decode section 24. The second decode section 24 converts an ROR pre-charge command RORPRE into a control command signal SD_CMD for a pre-charge request and outputs the control command signal SD_CMD. After a cycle time tRAS passes from an output of an ROR active command RORACT, an ROR pre-charge command RORPRE decoded to a control command signal SD_CMD is outputted (FIG. 18, region AA1). Furthermore, since a switch signal RORSW, which is one-clock cycled high level signal, is inputted to the address switch circuit 33, an ROR address RORADD is outputted to the synchronous-type semiconductor memory device 12 as control address SD_ADD while a switch signal RORSW is in high level. It should be noted that a refresh operation period of a refresh command RCMD is a total of a time tRAS and a pre-charge time tRP.

Thereby, in case a data input/output access operation period of an external command CMD comes earlier than a refresh operation period of a refresh command RCMD and an access region of the external command CMD and that of the refresh command RCMD do not coincide with each other provided that both of the commands are inputted simultaneously, even if operation periods of above those commands overlap, a refresh command RCMD and a control command signal SD_CMD are outputted from the refresh command generator circuit 31 and the command control circuit 34, respectively, and both of the operations are executed in parallel.

Figure 19:
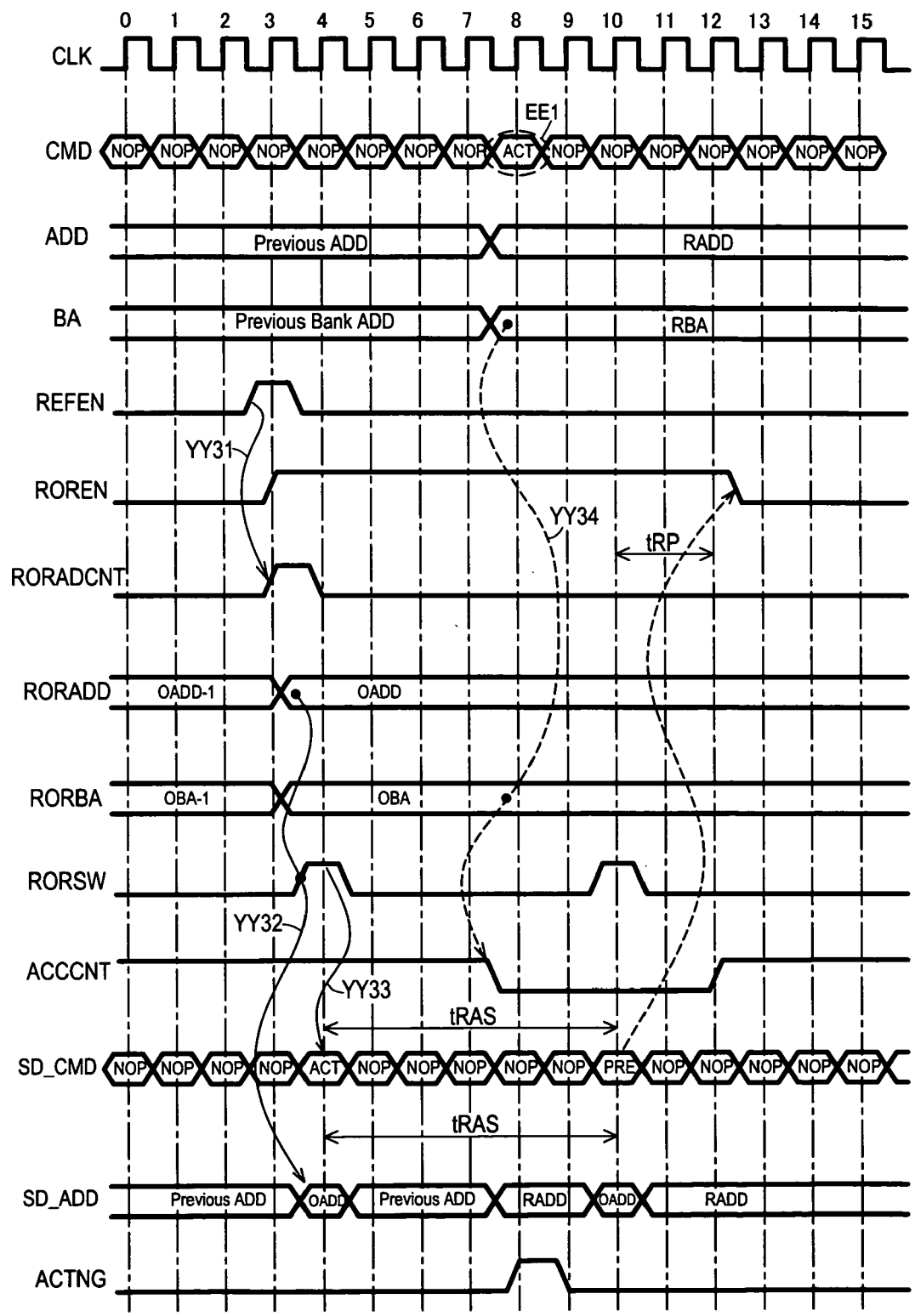
FIG. 19 shows operational waveform of the memory control device 1a obtained in case of operation (C)

By referring to FIG. 16 and FIG. 19, there will be described operation of the access region judge circuit 100 under the condition (C), i.e., a refresh operation period of a refresh command RCMD comes earlier than a data input/output access operation period of an external command CMD and an access region of the refresh command RCMD and that of the external command CMD coincide with each other provided that both of the commands are inputted simultaneously. When a refresh enable signal REFEN is inputted from the refresh interval timer 30 to the refresh command generator circuit 31, an ROR address count signal RORDCNT, a high-level pulse signal, is outputted from the refresh command generator circuit 31 to the ROR address counter 32 and count-up of ROR address count signals RORADD is conducted at the ROR address counter 32 (arrow YY31). In FIG. 11, when an ROR enable signal ROREN in high level is inputted to the counter section 40, the counter section 40 starts count operation along with a falling edge of an external clock CLK and then, either a combination of an ROR active command RORACT and a switch signal RORSW, both of which are high-level pulse signals or a combination of an ROR pre-charge command RORPRE and a switch signal RORSW, is outputted within a same clock. When a switch signal RORSW, a one-clock cycled high-level signal, is inputted to the address switch circuit 33, the address switch circuit 33 outputs an ROR address RORADD to the synchronous-type semiconductor memory device 12 as control address SD_ADD (arrow YY32). An ROR address RORADD is inputted from the ROR address counter 32 while a switch signal RORSW is in high level. Subsequently, an ROR active command RORACT is inputted to the command control circuit 34 together with a switch signal RORSW within a same clock and outputted to the synchronous-type semiconductor memory device 12 as control command signal SD_CMD (arrow YY33).

After a lapse of time tRAS corresponding to a six-clock cycle since the ROR active command RORACT is outputted, an ROR pre-charge command RORPRE is converted into a control command signal SD_CMD and outputted to the synchronous-type semiconductor memory device 12. After a lapse of pre-charge time tRP corresponding to a two-clock cycle, a pre-charge operation terminates. That is, a refresh operation period of a refresh command RCMD is a total of a time tRAS and a pre-charge time tRP. Here will be described a case that an external command CMD is inputted to the memory control device 1a during a refresh operation period of a refresh command RCMD. When an active command ACTV is inputted as an external command CMD during a refresh operation period of a refresh command RCMD (FIG. 19, region EE1), an ROR address RORADD after counted up and an external address ADD are inputted to the access region judge circuit 100 and coincidence judgment, i.e., whether or not an ROR bank address RORBA included in an ROR address RORADD and an external bank address BA included in an external address ADD coincide, is conducted at the coincidence judge section 94 (FIG. 16). Since both banks coincide with each other, an output from the coincidence judge section 94 is set in high level and since an ROR enable signal ROREN is in high level, an output from the NAND gate 97 (access control signal ACCCNT) is set in low level (not-accessible), (arrow YY34). When an access control signal ACCCNT in low level is inputted to the access control section 25 (FIG. 14) in the command control circuit 34, similar to described in the above, without transmission of an active command ACTV from the command control circuit 34 to the synchronous-type semiconductor memory device 12, an access no good signal ACTNG in high level is outputted from the command control circuit 34 to a not-shown CPU or the like. That is, failure of access to the synchronous-type semiconductor memory device 12 is informed. The CPU conducts an access operation again after level of an access control signal ACCCNT has shifted to high level since a predetermined time passes.

Figure 20:
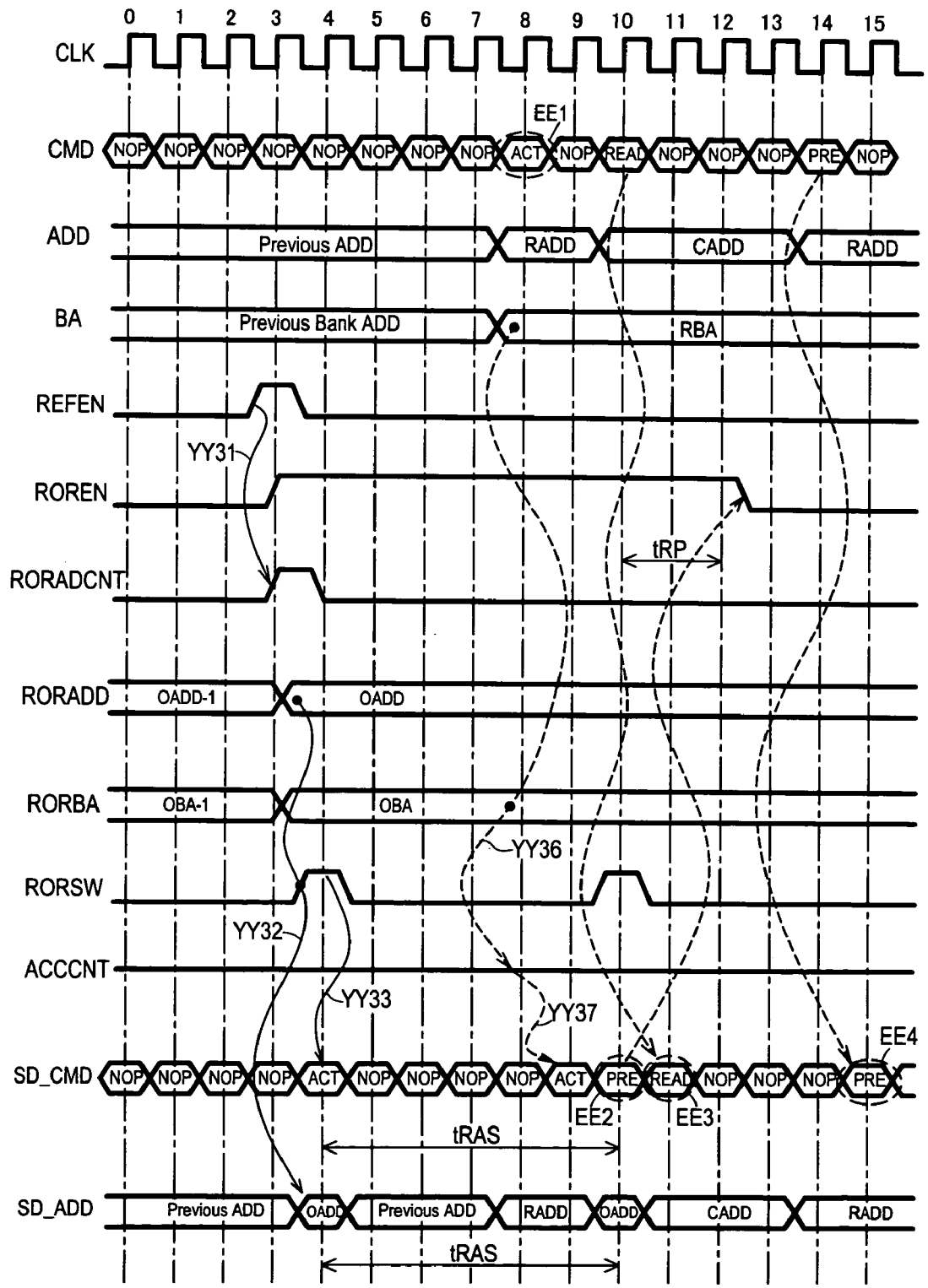
FIG. 20 shows operational waveform of the memory control device 1a obtained in case of operation (D)
Figure 21:
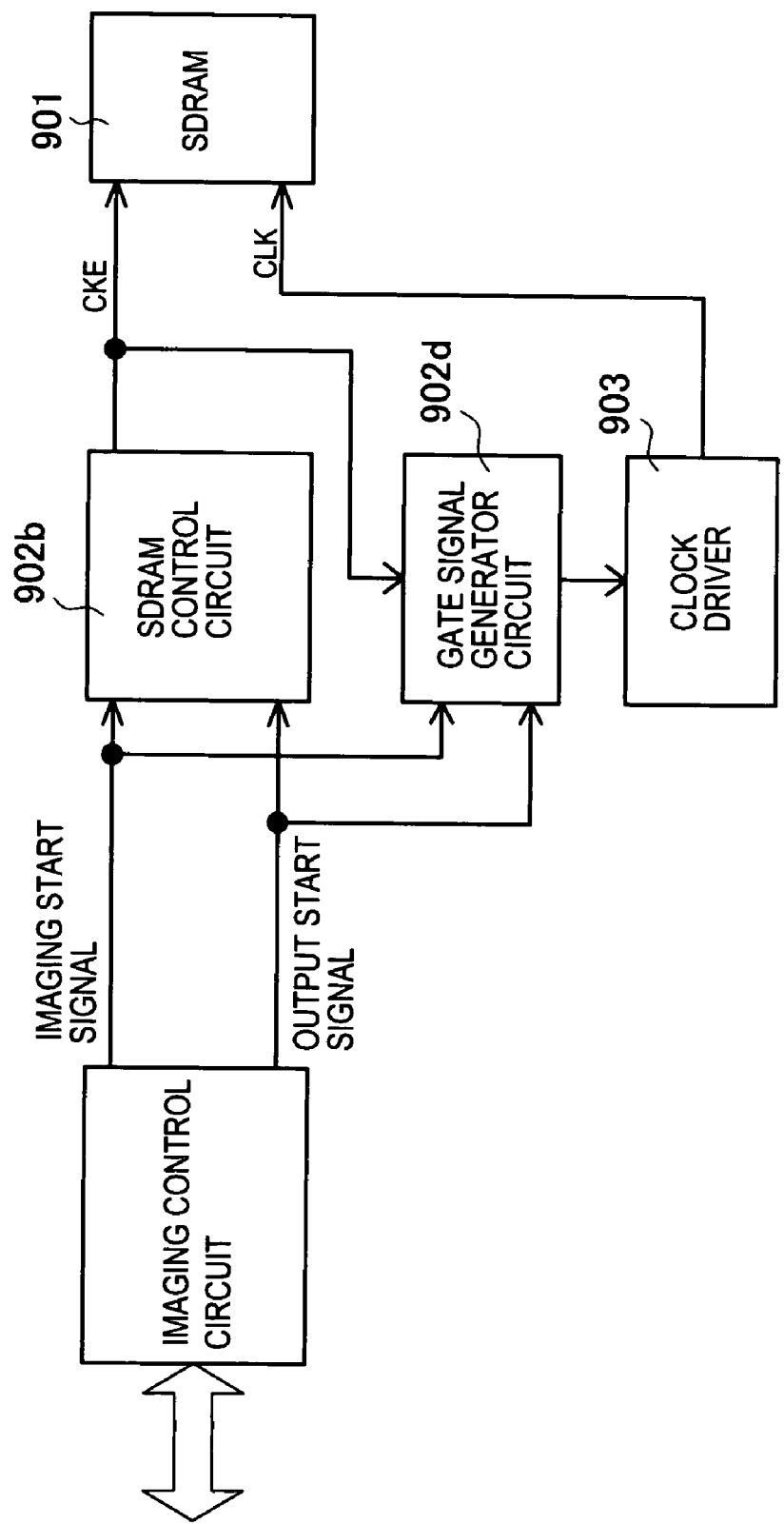
FIG. 21 is a block diagram of a conventional memory control device.
Figure 22:
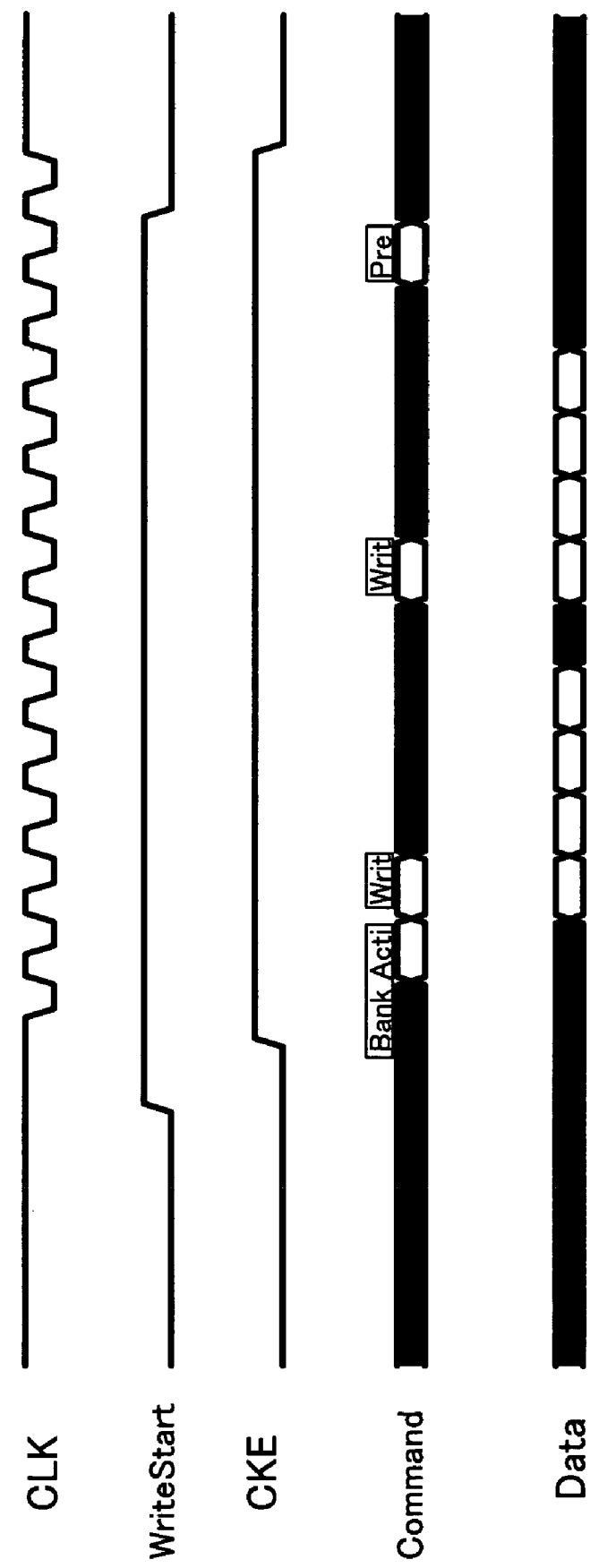
FIG. 22 shows timing chart of the conventional memory control device.

By referring to FIG. 16 and FIG. 20, there will be described operation of the access region judge circuit 100 under the condition (D), i.e., a refresh operation period of a refresh command RCMD comes earlier than a data input/output access operation period of an external command CMD and an access region of the refresh command RCMD and that of the external command CMD do not coincide with each other provided that both of the commands are inputted simultaneously. Similar to the condition (C), the following operations are conducted: count-up operation of ROR addresses RORADD at the ROR address counter 32 (arrow YY31); an operation to output an ROR address RORADD in the address switch circuit 33 to the synchronous-type semiconductor memory device 12 as control address SD_ADD (arrow YY32); and an operation to output an ROR active command RORACT in the command control circuit 34 to the synchronous-type semiconductor memory device 12 as control command signal SD_CMD (arrow YY33). Similar to operations under condition (C), when an active command ACTV is inputted as external command CMD (region EE1), an ROR address RORADD after counted up and an external address ADD are inputted to the access region judge circuit 100 and coincidence judgment, i.e., whether or not an ROR bank address RORBA included in an ROR address RORADD and an external bank address BA included in an external address ADD coincide, is conducted at the coincidence judge section 94 (FIG. 16). Since the two banks do not coincide, an output from the coincidence judge section 94 is set in low level and an access control signal ACCCNT, an output from the NAND gate 97, is kept in high level (accessible), (arrow YY36). When an access control signal ACCCNT in high level is inputted to the access control section 25 (FIG. 14) in the command control circuit 34, an active command ACTV is converted to a control command signal SD_CMD and the control command signal is transmitted from the command control circuit 34 to the synchronous-type semiconductor memory device 12, as previously described (arrow YY37). After that, an ROR pre-charge command RORPRE (region EE2) corresponding to a refresh command RCMD, a read command READ (region EE3) inputted as external command CMD, a pre-charge command PRE (region EE4) inputted as an external command CMD, and a control command signal SD_CMD corresponding to respective commands are outputted to the synchronous-type semiconductor memory device 12. That is, it is possible to input an external command CMD during a cycle time tRAS, i.e., a refresh operation period of a refresh command RCMD. Thereby, an operation by an external command CMD and a refresh operation can be executed in parallel. Accordingly, an overhead time for refresh does not increase and an access operation is not delayed.

Thereby, in case a refresh operation period of a refresh command RCMD comes earlier than a data input/output access operation period of an external command CMD and an access region of the refresh command RCMD and that of the external command CMD do not coincide with each other provided that both of the commands are inputted simultaneously, respective commands are converted into control command signals SD_CMD and outputted in parallel. In case a data input/output access operation period of an external command CMD and a refresh operation period of a refresh command RCMD overlap and access regions accessed by the above those commands coincide, parallel conversion processing is prohibited. Thereby, a command inputted later is never outputted to the synchronous-type semiconductor memory device 12 until an operation period of a command inputted earlier terminates. That is, parallel conversion processing operation can be done. Accordingly, even if the number of sense amplifiers to be activated concurrently during refresh operation is reduced and refresh frequency is increased, an operation by an external command CMD and a refresh operation can be executed in parallel. Accordingly, an overhead time for refresh increases little and an access operation is not delayed.

The present invention is not limited to the embodiment described above and may of course be improved or modified in various manners within the scope and spirit of the present invention.

According to the inventive memory control device and memory control method, the inventive memory control device restrains an output of a control clock during a period which does not require an input of control clock by each control signal, whereby power consumption due to inputs of control clocks to a synchronous-type semiconductor memory device and occurrences of power noises can be reduced. Furthermore, a refresh command and a refresh address generated in the memory control device are inputted to a synchronous-type semiconductor memory device, whereby the number of sense amplifiers to be activated simultaneously is reduced to lower a peak value of noises.

Furthermore, even if frequency of refresh operations increases, a synchronous-type semiconductor memory device can conduct a control such that an input/output access operation and a refresh operation are executed in parallel. Therefore, delay of an access operation can be prevented.

What is claimed is:

1. A memory control device for supplying a control clock and a control signal according to a to-be-inputted command signal to a synchronous-type semiconductor memory device, the memory control device comprising;
   the clock control circuit for informing a cycle period of a control clock required for executing a command at the synchronous type semiconductor memory device in accordance with the control signal; and
   a clock output circuit for outputting the control clock in accordance with an inform signal outputted from the clock control circuit.

2. A memory control device according to claim 1, wherein the clock output circuit receives an input of an external clock and outputs the external clock as the control clock in response to the inform signal.

3. A memory control device according to claim 1, wherein the clock control circuit receives an input of an external clock and outputs the inform signal which has a predetermined clock cycle period depending on the control signal basing on the external clock.

4. A memory control device according to claim 1, wherein the command signal corresponds to at least one of the followings commands: an active command, a read command, a write command, a pre-charge command, a refresh command, and a power-down command.

5. A memory control device for controlling a data input/output access operation of a synchronous-type semiconductor memory device including a plurality of access region to which data input and data output are made independently in accordance with access command and access address, the memory control device comprising:
   a refresh control circuit for generating refresh command and refresh address both required for a refresh operation of the synchronous-type semiconductor memory device, and a switch signal for informing every time the refresh command is generated; and
   an access control circuit for outputting the refresh command and the refresh address to the synchronous-type semiconductor memory device depending on the switch signal,
   wherein the memory control device controls the synchronous-type semiconductor memory device to conduct a data input/output access operation and a refresh operation in parallel.

6. A memory control device according to claim 5 further comprising an access region judge circuit for informing generation of a first access control signal or a second access control signal, which are signals to prohibit an output of either the access command or the refresh command to the synchronous-type semiconductor memory device, to the refresh control circuit or the access control circuit in case the access address and the refresh address are inputted, the access regions designated by the access and the refresh address are compared, and the access regions coincide with each other provided that a data input/output access operation period of the access command and a refresh operation period of the refresh command overlap.

7. A memory control device according to claim 6, wherein the refresh control circuit does not generate the refresh command and the refresh address in case prohibition of a refresh operation is informed by the first access control signal.

8. A memory control device according to claim 6, wherein the access control circuit does not output the access command and the access address to the synchronous-type semiconductor memory device but outputs an access no good signal to an external section in case prohibition of a data input/output access operation is informed by the second access control signal.

9. A memory control device according to claim 5, wherein:
   the first access control signal informs prohibition of the refresh operation to the refresh control circuit in case the access regions coincide with each other and the data input/output access operation period comes earlier than the refresh operation period; and
   the second access control signal informs prohibition of the data input/output access operation to the access control circuit in case the access region coincide with each other and the refresh operation period comes earlier than the data input/output access operation period.

10. A memory control device according to claim 5, wherein the access regions are bank regions plotted with bank addresses.

11. A memory control device according to claim 5, wherein the refresh operation consists of active command and pre-charge command, and the pre-charge command is outputted from the refresh control circuit after a lapse of predetermined time which starts with an output of the active command from the refresh control circuit.

12. A memory control method for supplying a control clock and a control signal depending on a to-be-inputted command signal to a synchronous-type semiconductor memory device, steps of the memory control method comprising:
   informing a cycle period of the a control clock required for executing a command at the synchronous-type semiconductor memory device in accordance with the control signal; and
   outputting the control clock in response to information of the cycle period of the control clock.

13. Memory control method for controlling a data input/output access operation of a synchronous-type semiconductor memory device including a plurality of access region to which data input and output are made independently in accordance with an access command and an access address, steps of the memory control method comprising:
   generating refresh command and refresh address both required for a refresh operation of the synchronous-type semiconductor memory device and a switch signal for informing every time the refresh command is generated; and
   outputting the refresh command and the refresh address to the synchronous-type semiconductor memory device depending on the switch signal,
   wherein the synchronous-type semiconductor memory device is controlled to conduct a data input/output access operation and a refresh operation in parallel.

* * * * *